US007507977B2

(12) United States Patent
Weiguo et al.

(10) Patent No.: US 7,507,977 B2
(45) Date of Patent: Mar. 24, 2009

(54) SYSTEM AND METHOD OF ION BEAM CONTROL IN RESPONSE TO A BEAM GLITCH

(75) Inventors: Que Weiguo, Melrose, MA (US); Yongzhang Huang, Hamilton, MA (US); John Ye, Brighton, MA (US); David Tao, Saugus, MA (US); Patrick Splinter, Middleton, MA (US)

(73) Assignee: Axcelis Technologies, Inc., Beverly, MA (US)

( * ) Notice: Subject to any disclaimer, the term of this patent is extended or adjusted under 35 U.S.C. 154(b) by 364 days.

(21) Appl. No.: 11/441,609

(22) Filed: May 26, 2006

(65) Prior Publication Data

US 2008/0067433 A1    Mar. 20, 2008

Related U.S. Application Data

(60) Provisional application No. 60/784,852, filed on Mar. 22, 2006, provisional application No. 60/781,977, filed on Mar. 14, 2006.

(51) Int. Cl.
*G21K 5/10*    (2006.01)

(52) U.S. Cl. .............................. 250/492.21; 250/492.2; 250/492.1; 250/492.3; 315/111.21; 315/111.81; 361/55; 361/56; 307/100; 307/141; 307/141.4; 307/139; 702/57; 702/58; 702/60

(58) Field of Classification Search ............ 250/492.21, 250/492.2, 492.1, 492.3, 423 R, 426; 315/111.21, 315/111.81; 361/55, 56; 307/100, 141, 141.4, 307/139; 702/57, 58, 60
See application file for complete search history.

(56) References Cited

U.S. PATENT DOCUMENTS 5,132,545 A    7/1992    Shono et al.
(Continued)

FOREIGN PATENT DOCUMENTS

EP    0 480 689 A2    4/1992
(Continued)

OTHER PUBLICATIONS

International Search Report, Int'l Application No. PCT/US2007/006069, Int'l Filing Date Mar. 9, 2007, 3 pgs.
(Continued)

*Primary Examiner*—Jack I Berman
*Assistant Examiner*—Michael Maskell
(74) *Attorney, Agent, or Firm*—Eschweiler & Associates, LLC

(57) ABSTRACT

The present invention is directed to a switch circuit and method to quickly enable or disable the ion beam to a wafer within an ion implantation system. The beam control technique may be applied to wafer doping repaint and duty factor reduction. The circuit and method may be used to quench an arc that may form between high voltage electrodes associated with an ion source to shorten the duration of the arc and mitigate non-uniform ion implantations. The circuit and method facilitates repainting the ion beam over areas where an arc was detected to recover dose loss during such arcing. A high voltage high speed switching circuit is added between each high voltage supply and its respective electrode to quickly extinguish the arc to minimize disruption of the ion beam. The high voltage switch is controlled by a trigger circuit which detects voltage or current changes to each electrode. Protection circuits for the HV switch absorb energy from reactive components and clamp any overvoltages.

34 Claims, 15 Drawing Sheets

U.S. PATENT DOCUMENTS

| | | | |
|---|---|---|---|
| 5,192,894 | A | 3/1993 | Teschner |
| 5,212,425 | A | 5/1993 | Goebel et al. |
| 5,247,418 | A | 9/1993 | Auge |
| 6,452,196 | B1 * | 9/2002 | Vanderberg ............ 250/492.21 |
| 6,577,479 | B1 * | 6/2003 | Springer et al. ............... 361/55 |
| 2005/0092596 | A1 | 5/2005 | Kouznetsov |
| 2005/0116690 | A1 | 6/2005 | Adachi |
| 2005/0181584 | A1 * | 8/2005 | Foad et al. .................. 438/514 |

FOREIGN PATENT DOCUMENTS

| | | |
|---|---|---|
| EP | 1 111 651 A2 | 6/2001 |
| JP | 08064166 | 3/1996 |
| WO | WO 2006/047564 A2 | 5/2006 |
| WO | WO 2006/047564 A3 | 5/2006 |

OTHER PUBLICATIONS

Devries G. J. et al.; "Ion Source Metal-Arc Fault Current Protection Circuit" Review of Scientific Instruments USA, vol. 62, No. 12, Dec. 1991, pp. 3098-3099.

PCT International Search Report for International Application PCT/US07/006073 mailed Sep. 27, 2007, pp. 1-5.

* cited by examiner

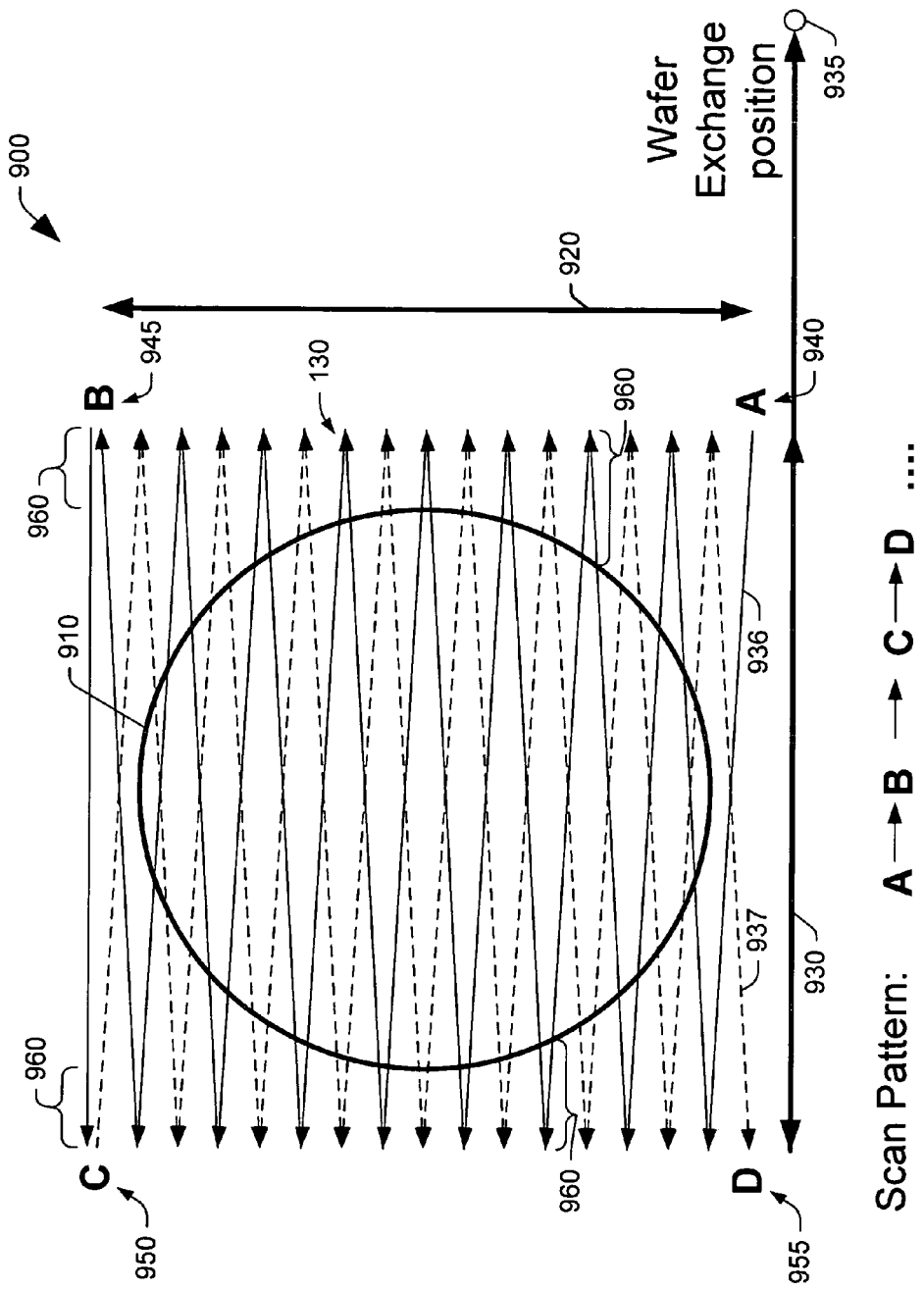

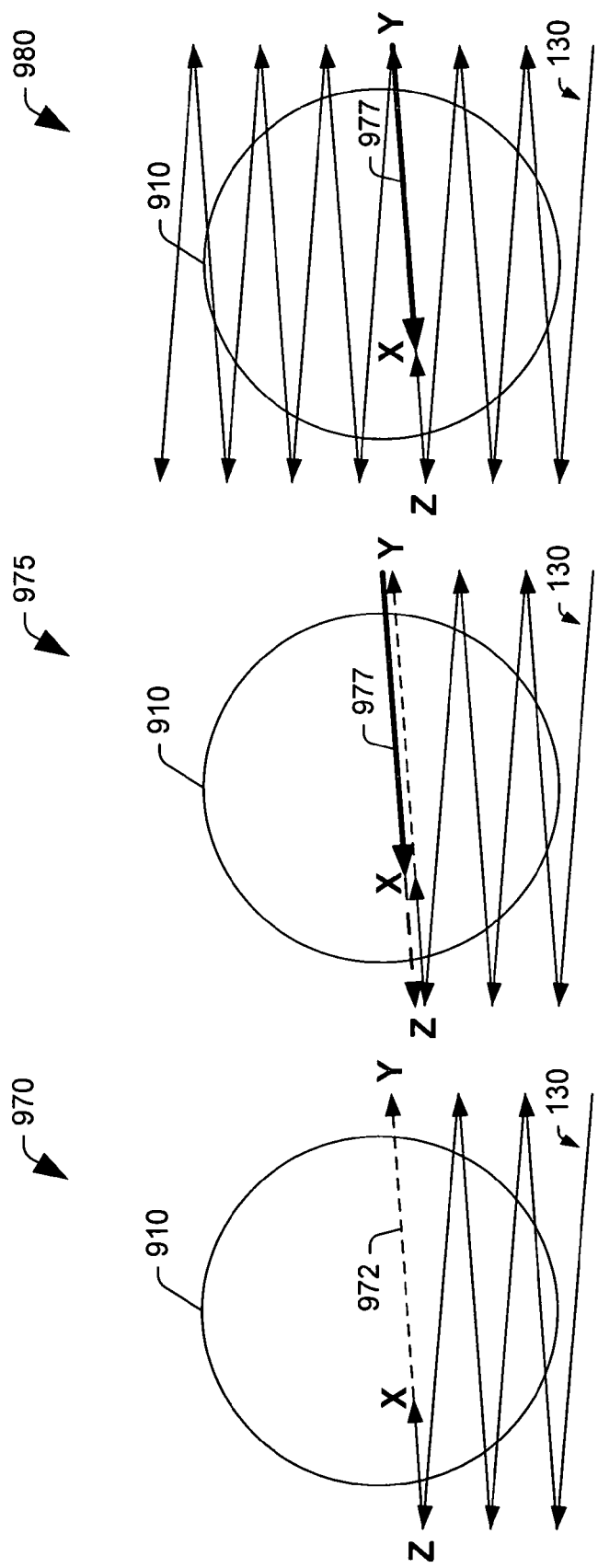

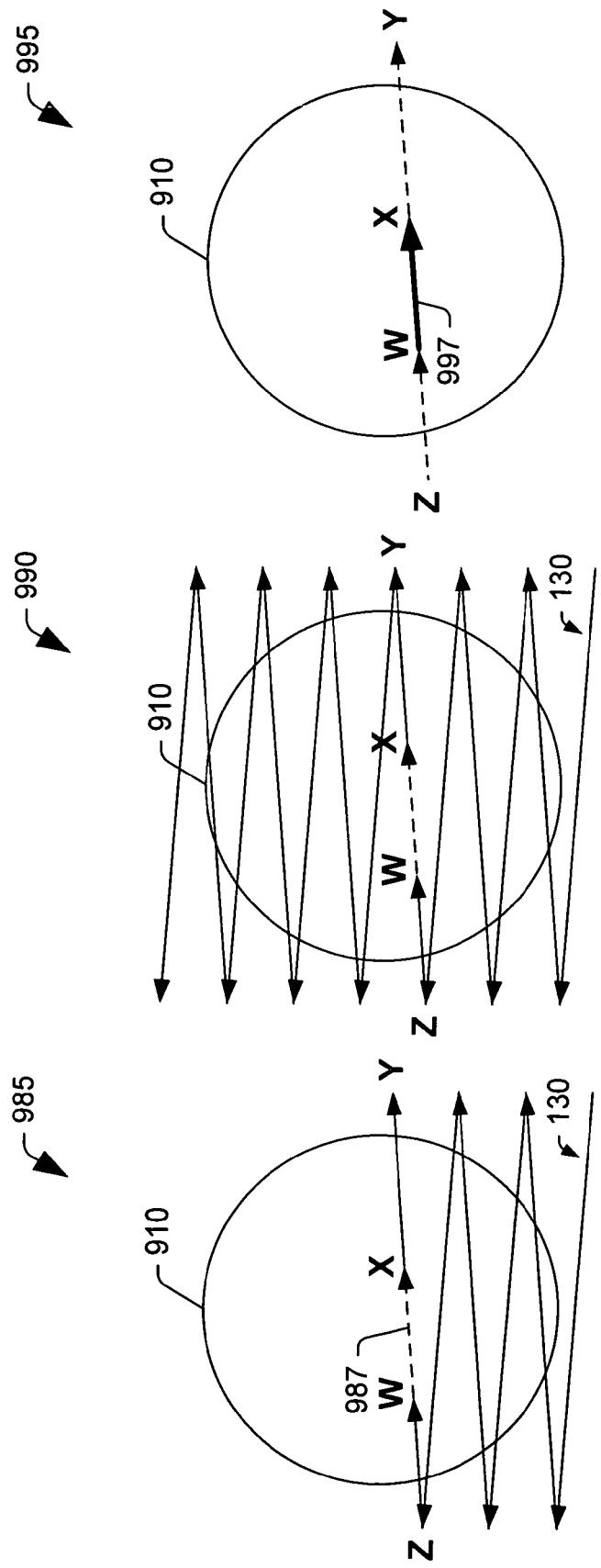

SYSTEM AND METHOD OF ION BEAM CONTROL IN RESPONSE TO A BEAM GLITCH

REFERENCE TO RELATED APPLICATION

This application claims priority to and the benefit of U.S. Provisional Application Ser. Nos. 60/781,977 which was filed Mar. 14, 2006, entitled ARC QUENCHING CIRCUIT TO MITIGATE ION BEAM DISRUPTION, and 60/784,852 which was filed Mar. 22, 2006, entitled A METHOD OF ION BEAM CONTROL FOR GLITCH RECOVERY the entirety of which is hereby incorporated by reference as if fully set forth herein.

FIELD OF THE INVENTION

The present invention relates generally to ion implantation systems, and more particularly to an arc quenching circuit for extinguishing an arc that may form between high voltage electrodes within an ion implantation system, and to a method of repainting the ion beam to recover any dose losses during such arcing to attain more uniform ion implantations and duty factor reduction.

BACKGROUND OF THE INVENTION

Ion implantation systems are used to impart impurities, known as dopant elements, into semiconductor substrates or wafers, commonly referred to as workpieces. In such systems, an ion source ionizes a desired dopant element, and the ionized impurity is extracted from the ion source as a beam of ions. The ion beam is directed (e.g., swept) across respective workpieces to implant ionized dopants within the workpieces. The dopant ions alter the composition of the workpieces causing them to possess desired electrical characteristics, such a may be useful for fashioning particular semiconductor devices, such as transistors, upon the substrates.

The continuing trend toward smaller electronic devices has presented an incentive to "pack" a greater number of smaller, more powerful and more energy efficient semiconductor devices onto individual wafers. This necessitates careful control over semiconductor fabrication processes, including ion implantation and more particularly the uniformity of ions implanted into the wafers. Moreover, semiconductor devices are being fabricated upon larger workpieces to increase product yield. For example, wafers having a diameter of 300 mm or more are being utilized so that more devices can be produced on a single wafer. Such wafers are expensive and, thus, make it very desirable to mitigate waste, such as having to scrap an entire wafer due to non-uniform ion implantation. Larger wafers and high density features make uniform ion implantation challenging, however, since ion beams have to be scanned across larger angles and distances to reach the perimeters of the wafers, yet not miss implanting any region therebetween.

In addition, the high voltage necessary to supply the ion source of such an ion beam is subject to occasional arcing between the various extraction and suppression electrodes and other nearby parts. This tendency for arcing often fully discharges one or more affected HV supplies until the arc naturally self-extinguishes at a much lower supply voltage. While arcing, the beam current may become serious erratic or may be interrupted until the supply voltage is restored, during which time ion implantation may experience intermittent or non-uniform ion implantation dose levels. Accordingly, there is a need for mitigating the effects of HV arcing associated with an ion source or the electrodes of an ion implanter to provide uniform implantation over such larger implantation angles and distances of the ion beam.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to the more detailed description that is presented later.

The present invention is directed to a circuit for quenching an arc that may form between high voltage (HV) electrodes associated with the ion source of an ion implantation system to shorten the duration of the arc, to mitigate erratic ion beam current, and to mitigate non-uniform ion implantations, for example. Several high voltage high speed (HVHS) switching circuit arrangements are disclosed that each incorporate a HVHS switch added in series between each high voltage supply and its respective electrode (e.g., a suppression or extraction electrode) associated with the ion source for quickly extinguishing the harmful arcs. The arcs that otherwise form in these areas have a tendency to substantially discharge the high voltage capacitors within such HV power supplies, for example, for the ion source or extraction electrode supply voltage (Vext), or the suppression electrode supply voltage (Vsup). Consequently, the ion beam current is dramatically affected by these "glitches" in the ion beam current (Ibeam), and accordingly takes considerable time thereafter for the supply voltages and beam current Ibeam to recover. Thus, the arc quench circuit of the present invention mitigates ion beam disruption and speeds beam current recovery.

Further, the circuit and method also facilitates repainting the ion beam over those areas where an arc was detected to recover any dose loss during such arcing. The circuit also comprises a motion control system operable to control horizontal and vertical scan motions of a wafer implanted by the ion implanter, to monitor horizontal and vertical scan positions associated with the detection of the arc, and to initiate a return to an initial position along a scan associated with the detection of the arc.

The trigger control circuit of the present invention may also be further operable to receive a repaint command from the motion control system, and to force the HV switch on or off in response to the repaint command in order to repaint the ion beam between the initial position along the scan associated with the detection of the arc and a final position associated with the detection of the arc, thereby recovering any dose loss during such arcing.

According to one or more aspects of the present invention, an arc quenching circuit for an ion source of an ion implantation system suitable for use in implanting ions into one or more workpieces is disclosed. In one aspect of the invention, the system includes one or more high voltage high speed (HS) switches connected in series with a HV power supply (HVPS) for the ion source (or one of several HV extraction or suppression electrodes), the HVHS switches operable to interrupt the HV power supply current to the ion source or electrodes to quench the arc, and further operable to reestablish the power supply current. The quantities of ions that can be extracted from the ion source are in the form of an ion beam having a beam current. The system also includes a trigger control circuit operable to detect a current or voltage change associated with the ion source or HV electrodes and to control the one or more HVHS switches to open or close based on the current or voltage change detection. One or more protection circuits are also included to protect the respective HVHS switch, and are operable to absorb energy from reactive elements external to the respective HV switch, and to clamp an over-voltage that may occur across the switch.

In another aspect of the invention the system further comprises a synchronization circuit operable to synchronize and time the trigger control circuits of two or more arc quenching circuits for the opening and closing of two or more high voltage switches.

In still another aspect, the current or voltage change detection associated with the ion source comprises detecting one of a current surge in the HV power supply, a decrease in an ion beam current, a drop in a suppression electrode voltage, and a drop in an extraction electrode voltage.

In yet another aspect, one of the protection circuits is connected in series with the HV switch it protects.

In one aspect, one of the protection circuits is connected in parallel with the HV switch it protects.

In another aspect of the present invention the system further comprises an extraction suppression electrode located close to the ion source.

In still another aspect, the current or voltage detection is accomplished during the ion implantation process to facilitate feedback or closed-loop adjustments to the ion source current or voltage.

In yet another aspect, the current or voltage detection is accomplished prior to the ion implantation process to facilitate open loop adjustments to the ion source current or voltage.

In another aspect, the current or voltage detection is accomplished during the ion implantation process to facilitate feedback or closed-loop adjustments to the ion beam current.

In accordance with one or more other aspects of the present invention, an arc quenching circuit for a high voltage power supply of an ion implantation system is also disclosed comprising a high voltage switch connected in series with a high voltage power supply for an electrode associated with the implanter, operable to interrupt and reestablish a current to the electrode, to quench an arc produced within the ion implantation system. The system also includes a trigger control circuit operable to detect a current or voltage change associated with the electrode and to control the one or more HV switches to open or close based on the detection. Finally, the system comprises one or more protection circuits, each protection circuit associated with one of the high voltage switches, operable to absorb energy from reactive elements external to the respective HV switch, and to limit an over-voltage across the switch.

In accordance with another aspect of the present invention, a method of quenching an arc in an ion implantation system and repainting the ion beam to recover any dose loss during such arcing using an arc quenching circuit associated with a high voltage supply for an electrode of the ion implantation system comprises horizontally scanning a wafer in front of the ion beam, vertically scanning the wafer in front of the ion beam, detecting a current or voltage change associated with an arc at the electrode, monitoring the horizontal and vertical scan positions associated with the detection of an arc, and monitoring the time duration associated with the detection of an arc. The method further comprises controlling a HV switch connected between the high voltage supply and the electrode to open when an arc is detected in order to interrupt an arc current to the electrode and to quench the arc, controlling the HV switch to close when the arc is not detected in order to connect the high voltage supply to the electrode and to establish the ion beam, and repainting the ion beam after an arc.

In another aspect of the invention the repainting process comprises
moving the wafer to a first horizontal and vertical scan position associated with an initial detection of the arc, and closing the HV switch to enable the ion beam, and scanning the wafer horizontally and vertically in front of the ion beam until a second horizontal and vertical scan position associated with a final detection of the arc is encountered, and opening the HV switch to disable the ion beam.

In yet another aspect of the invention the method further comprises synchronizing two or more arc quenching circuits having two or more high voltage switches used to quench an arc between the electrodes of two or more respective high voltage power supplies for the ion implanter, and repainting the ion beam subsequent to detecting an arc from the electrodes.

In another aspect of the present invention the repainting process is only accomplished if the time duration of the arc detected is longer than a predetermined interval.

In still another aspect, the repainting process is delayed until the ion beam scan returns to a wafer exchange position of the wafer.

In yet another aspect, the repainting process is delayed until the ion beam scan completes a current horizontal scan movement.

In one aspect, the horizontal and vertical scanning continue after the detection of an arc.

In another aspect, the repainting process is delayed until the end of the ion beam scans, wherein one or more arc detections may be repainted collectively during one or more continuous scan movements.

To the accomplishment of the foregoing and related ends, the following description and annexed drawings set forth in detail certain illustrative aspects and implementations of the invention. These are indicative of but a few of the various ways in which the principles of the invention may be employed. Other aspects, advantages and novel features of the invention will become apparent from the following detailed description of the invention when considered in conjunction with the drawings.

BRIEF DESCRIPTION OF THE DRAWINGS

FIG. 9A is a simplified diagram of normal 2D wafer scanning motion between an exemplary ion beam and a wafer, wherein the wafer is moved simultaneously in a horizontal and vertical direction by a motion control system in accordance with one or more aspects of the present invention;

FIGS. 9B, 9C and 9D are simplified diagrams of 2D wafer scan motion between an exemplary ion beam and a wafer similar to that of FIG. 9A, wherein when an arc is encountered, the ion beam may be disrupted for a longer duration creating a glitch stripe having a corresponding longer loss of dose, such disrupted areas as may be repainted in accordance with one or more aspects of the present invention;

FIGS. 9E, 9F and 9G are simplified diagrams of 2D wafer scan motion between an exemplary ion beam and a wafer similar to that of FIG. 9A, wherein when an arc is encountered, the ion beam may be disrupted briefly creating a glitch hole having a corresponding brief loss of dose, such disrupted areas as may be repainted in accordance with one or more other aspects of the present invention;

DETAILED DESCRIPTION OF THE INVENTION

Figure 1:
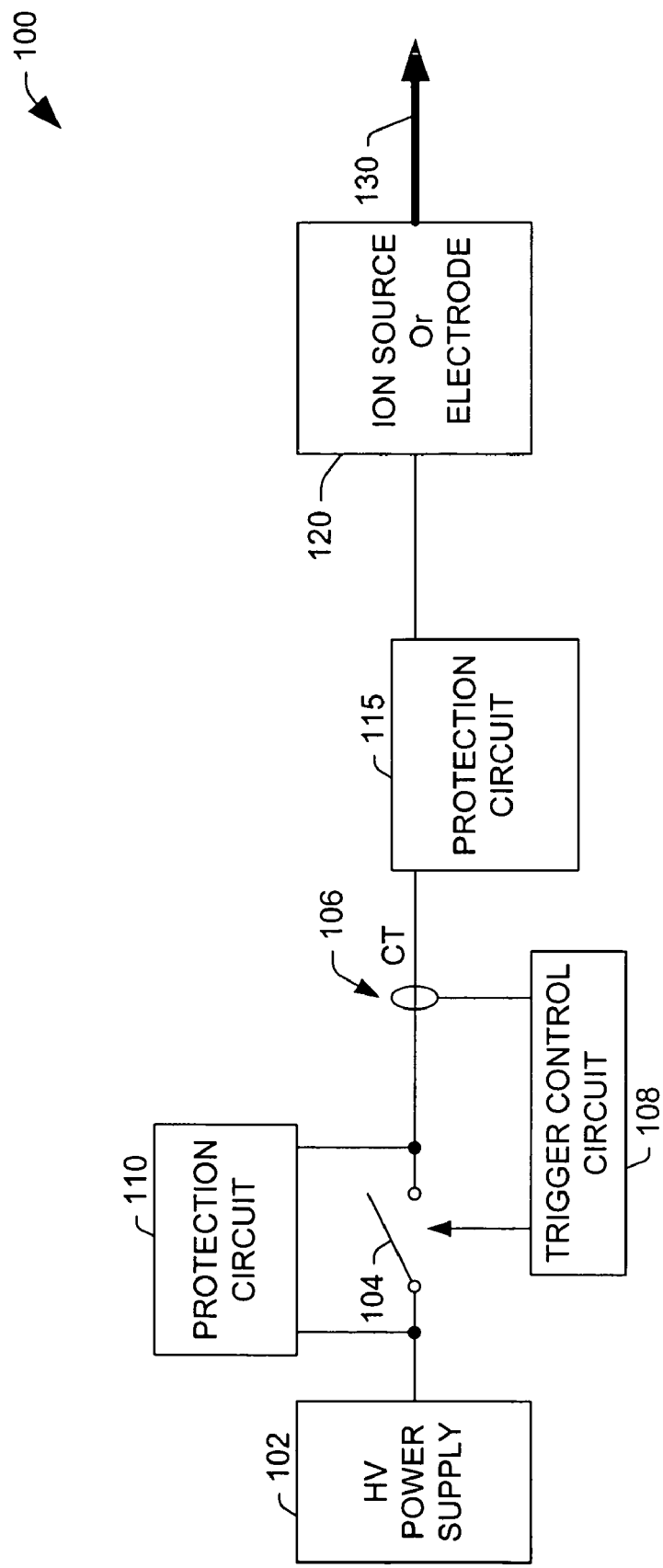
FIG. 1 is a schematic block diagram illustrating components of an ion implantation system according to one or more aspects of the present invention to quench an arc associated with an ion source of the ion implanter.

The present invention will now be described with reference to the drawings wherein like reference numerals are used to refer to like elements throughout. The illustrations and following descriptions are exemplary in nature, and not limiting. Thus, it will be appreciated that variants of the illustrated systems and methods and other such implementations apart from those illustrated herein are deemed as falling within the scope of the present invention and the appended claims.

The present invention relates to quenching an arc that may form between high voltage extraction or suppression electrodes, for example, associated with an ion source of an ion implantation system. An arc quenching circuit is discussed that shortens the duration of the arc, thereby mitigating the duration of erratic ion beam current, and minimizing the non-uniformity of ion implantations, for example.

Further, the circuit and method also facilitates repainting the ion beam over those areas where an arc was detected in order to recover any dose loss during such arcing. In one aspect, the circuit may also comprise or communicate with a motion control system operable to control horizontal and vertical scan motions of a wafer implanted by the ion implanter, to monitor horizontal and vertical scan positions associated with the detection of the arc, and to initiate a return to an initial position along a scan associated with the detection of the arc.

In accordance with the present invention, high voltage high speed (HVHS) switching circuits comprising HVHS switches (e.g., 65 KV @ 2 MHz MOSFET switches) are added in series with the high voltage supplies to the suppression and/or extraction electrodes, or ground electrodes, for example, to extinguish the harmful arcs. When such HV arcs occur, the high voltage capacitors of such HV power supplies may be substantially discharged. This deep discharge dramatically affects the ion beam current and requires considerable time thereafter for the power supply voltages and the ion beam current Ibeam to recover. Such high voltage high speed switches have just recently become available as a manufactured item, and thus find immediate use in such applications incorporating the arc quenching circuit(s) of the present invention.

Advantageously, these HVHS switches also provide the ion implanter with the ability to simply turn the ion beam ON or OFF at will, either manually with a switch or via command from one of the implanters control systems, its computer, or by an external input. As ion implanters may take a considerable time to sequence through a power up and warm up to a stable ion beam level that is useful for implantation, it is a tremendous advantage, after such a warm-up, to be able to turn the beam ON/OFF, for example, when loading or unloading a new wafer, at the start/end of each wafer scan, and if desired, even in portions of the over-travel regions of each row scan of a wafer. Thus, the system of the present invention facilitates this beneficial feature, known as "beam duty factor", which is the ratio of ON to OFF time of the ion beam. By having this ability to reduce this beam duty factor, the inventors of the present system also anticipate reducing the particle count on a wafer, because the beam will be used to a greater percentage usefully on the wafer and less on peripheral surfaces adjacent to the wafer.

The high voltage switches are controlled by trigger circuits which detect current or voltages changes in the HV supplies to the electrodes, such changes as are associated with the formation of an arc at one of the electrodes. The arc quenching circuit also comprises one or more protection circuits for the HV switches to absorb excess energy from reactive components surrounding the HVHS switches and clamp any overvoltages from the HVHS switches. The protection circuits may be connected in parallel with and/or in series with a respective HVHS switch. The arc quenching circuits of the present invention may further comprise a synchronization circuit to sequence and synchronize the reestablishment of the current and voltage to each of three electrodes and high voltage supply circuits associated with an ion implantation system.

To facilitate repainting the ion beam over those areas where the arc has occurred, the circuitry of the present invention also communicates with the motion control system of the ion implanter. In particular, during a typical implantation scan, horizontal (e.g., row) and vertical motion of the wafer in front of the ion beam (or the beam relative to the wafer) is monitored, typically by the motion control system. When an arc occurs, the initial and final horizontal and vertical positions associated with the arc detection, for example, are stored for a subsequent repaint process. Then, at the end of a particular row scan, or at the end of the wafer scan, for example, around the load/unload or wafer exchange position, the motion control system initiates the repaint process.

In the repaint process, the ion beam is first disabled by opening the HVHS switch, and the wafer is moved to a first horizontal and vertical scan position associated with the initial detection of the arc. Optionally, the beam may be scanned over the wafer if the implanter facilitates this type of scanning. Alternately, the repaint process may return the wafer motion to the beginning of the row (horizontal) scan wherein the arc was initially detected, where the scan motion can begin a row as usual prior to the position of the initial arc detection. This variation may be preferable, as the scan motion would then be fully accelerated up to the same speed as that which was present when the arc was initially detected. Thereafter, when the ion beam is at the position of initial arc detection, the beam is enabled by closing the HVHS switch, while the wafer is horizontally and vertically scanned until a second horizontal and vertical scan position is encountered associated with a final detection of the arc. When this final detection point is reached, the HVHS switch is opened to disable the ion beam.

Although the HVHS arc quenching circuit of the present invention is illustrated and described in the context of ion sources and ion implanters, those skilled in the art may appreciate that such high voltage high speed arc quenching circuits may also be utilized in other applications requiring HV and high speed arc quenching, such as x-ray equipment, accelerators, other ion source applications, for example. In this manner, unwanted arc shorting of high voltage supplies may be quenched before the high voltage power supply has been significantly discharged and has had a chance to affect the output of related systems (e.g., the ion beam of an ion implanter).

Referring initially to FIG. 1, an exemplary arc quenching circuit 100 for a high voltage supply of an ion source suitable for implementing one or more aspects of the present invention is depicted in block diagram form. The circuit 100 includes a high voltage power supply 102, a high voltage high speed HVHS switch 104, a current transformer (CT) 106 for detecting a change of current in the supply 102 to an ion source 120 for producing a quantity of ions that can be extracted in the form of an ion beam 130. The change of supply current to the ion source 120 is detected by the CT 106 and a trigger control circuit 108 which opens HVHS switch 104 when a current surge is detected.

The HVHS switch 104 is protected by parallel and series protection circuits 110 and 115, respectively, to absorb energy from reactive components surrounding the switch 104 and protect the switch from over-voltage damage. The protection circuits 110 and 115 also protect the switch 104 and other components of the ion implanter, by dampening any ringing induced by switching transients and the reactive components external to the HVHS switch 104. The arc quenching circuit 100 may be used in any ion implanter, or other such applications as may use a high voltage supply subject to arc discharges at the output of the supply.

For example, arc quenching circuit 100 operates by detecting a current surge in CT 106 when an arc occurs within the ion source 120, at the extraction electrodes, or at the output of the ion source, for example, as in the ion beam current. The trigger control circuit 108 receives the current surge detection from the CT 106 and in turn controls the HVHS switch 104 to open. When HVHS switch 104 opens, the arc current through CT 106 drops to near zero and the arc extinguishes or "quenches".

The inventors of the present invention have further found that the arc must remain extinguished for a finite period of time before the HVHS switch is closed again, or the more conductive gaseous byproducts from the arc which remain in the region, will permit the arc to reoccur. Thus, a delay time within the trigger control circuit or within a synchronization circuit, (e.g., 740 of FIG. 7), may provide such a delay, and will be discussed further infra. Alternately, the switch may be allowed to repeatedly open and close until the arc no longer reoccurs.

Figure 2:
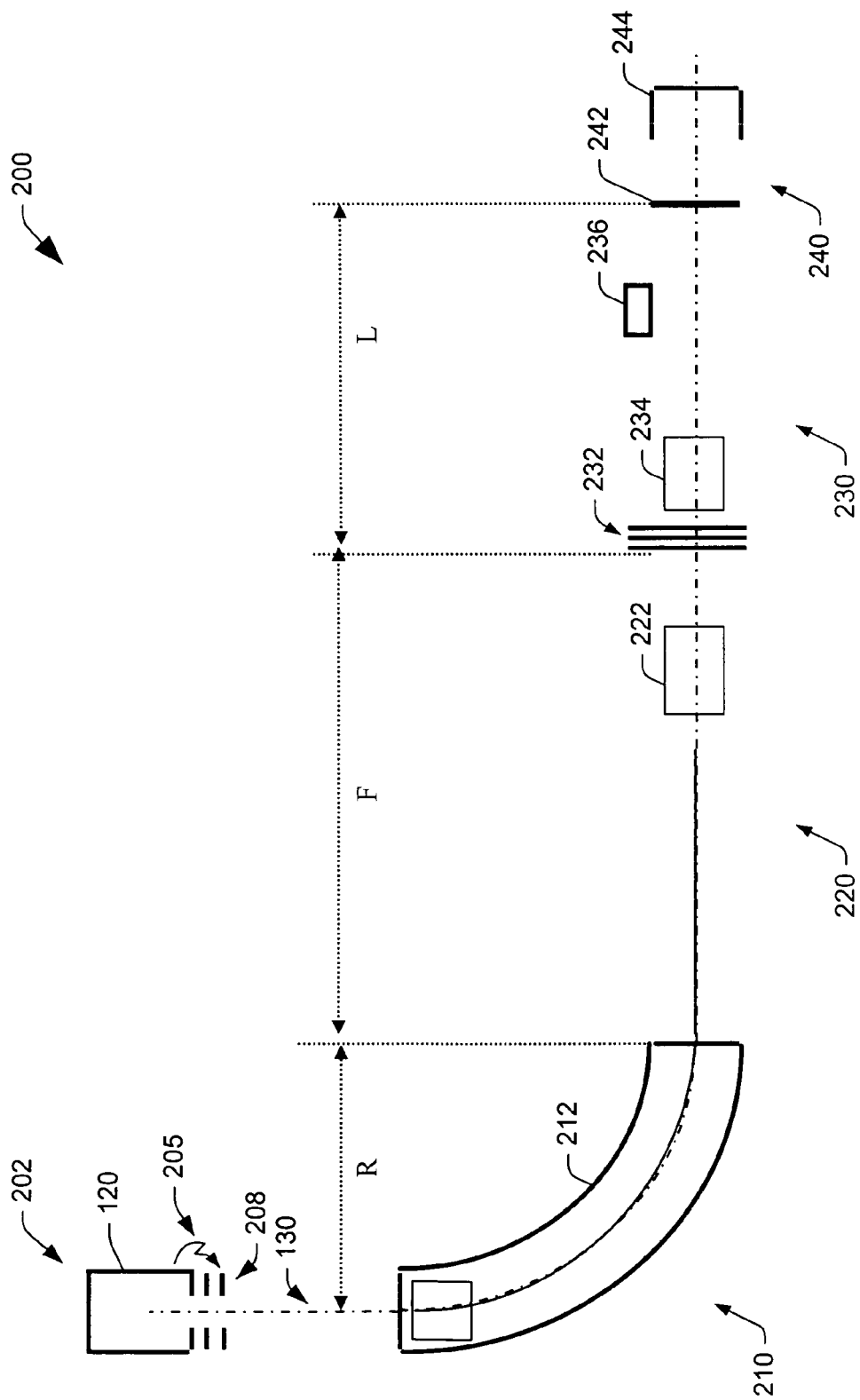
FIG. 2 is a simplified block diagram of an exemplary ion implantation system such as may utilize the arc quenching circuit of the present invention.

FIG. 2 illustrates an exemplary ion implantation system 200 such as may utilize the arc quenching circuit similar to that of 100 of FIG. 1, of the present invention. For example, ion implantation system 200 comprises an ion source 120 having several extraction electrodes 208, for providing a source of ions as an ion beam 130 for implantation system 200. The ions within ion beam 130 are initially analyzed in a first region 210 by a mass analyzing magnet 212 by way of magnetic deflection to filter ions of unwanted mass or energy. The mass analyzing magnet 212 operates to provide a field across the beam path 130 so as to deflect ions from the ion beam 130 at varying trajectories according to mass (e.g., charge to mass ratio). Ions traveling through the magnetic field experience a force that directs individual ions of a desired mass along the beam path 130 and deflects ions of undesired mass away from the beam path.

Those ions of ion beam 130 having the desired mass and energy are then accelerated or decelerated in a second region 220, focused by resolving aperture and deceleration plates 232, measured by setup faraday cup 234, and in region 230, the beam is conditioned by a plasma shower 236 providing for space charge neutralization. Finally, the ion beam 130 enters an end station 240 for implantation in a wafer 242 the dose level of which is measured by a disk faraday cup 244.

During ion implantation, an arc 205 may occur between the high voltage extraction, suppression, or ground electrodes, for example, associated with the ion source. In conventional implantation systems, this arc has a tendency to completely discharge the high voltage supply before the arc self-extinguishes. The arc quenching circuit 100 of FIG. 1, for example, is designed to avoid this problem.

Figure 3:
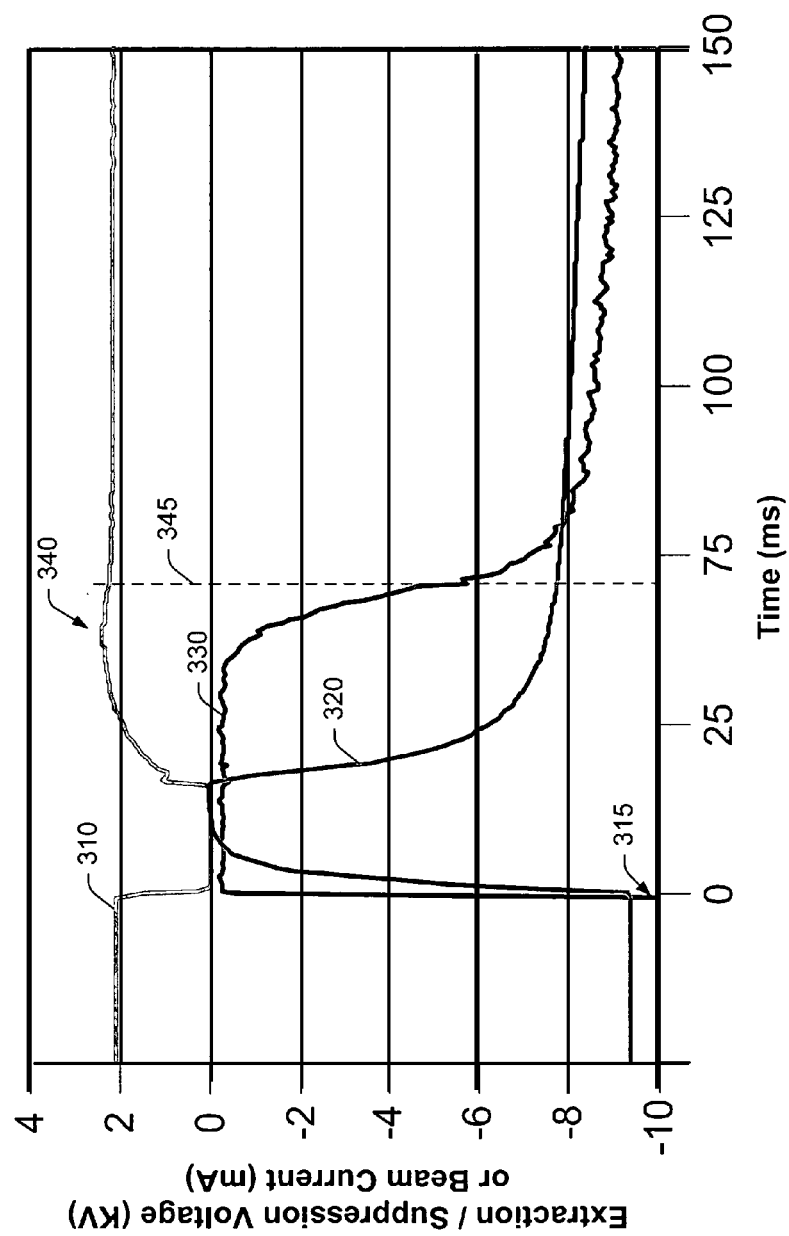
FIG. 3 is a plot of the change in the beam current and the extraction and suppression voltages within an ion implanter during arcing of the high voltage electrodes of the ion implantation system of FIG. 2.

FIG. 3, for example, illustrates a plot 300 of the change in the beam current which results when an arc occurs in the high voltage extraction and suppression voltages of an ion implanter similar to the ion implantation system of FIG. 2.

Plot 300 of FIG. 3, for example, illustrates that an arc discharges extraction voltage 310 from about 2.2 KV to near 0V at a time 315 at about 0 ms. At about the same time, the suppression voltage 320 drops from about −9.3 KV to near 0V while the beam current Ibeam 330 drops to near 0 mA. As the extraction and suppression voltages 310, and 320, respectively, fall to near 0 volts, the arc self extinguishes, thereby allowing these voltages to recharge toward their original voltage levels. As shown at 340, the extraction voltage 310 overshoots this original voltage, and detrimentally delays the recovery of beam current Ibeam 330 until time 345 at about 67 ms wherein extraction voltage 310 has generally recovered. It may be observed from plot 300 that extraction voltage changes have a relatively large and lasting impact on beam current. Thus, FIG. 3 suggests that it may be very beneficial to quickly open the high voltage current paths between the electrodes for the ion beam and the high voltage supplies for the electrodes before the HV supplies have had a chance to significantly discharge. The HVHS switch of the present invention accomplishes this goal.

Figure 4:
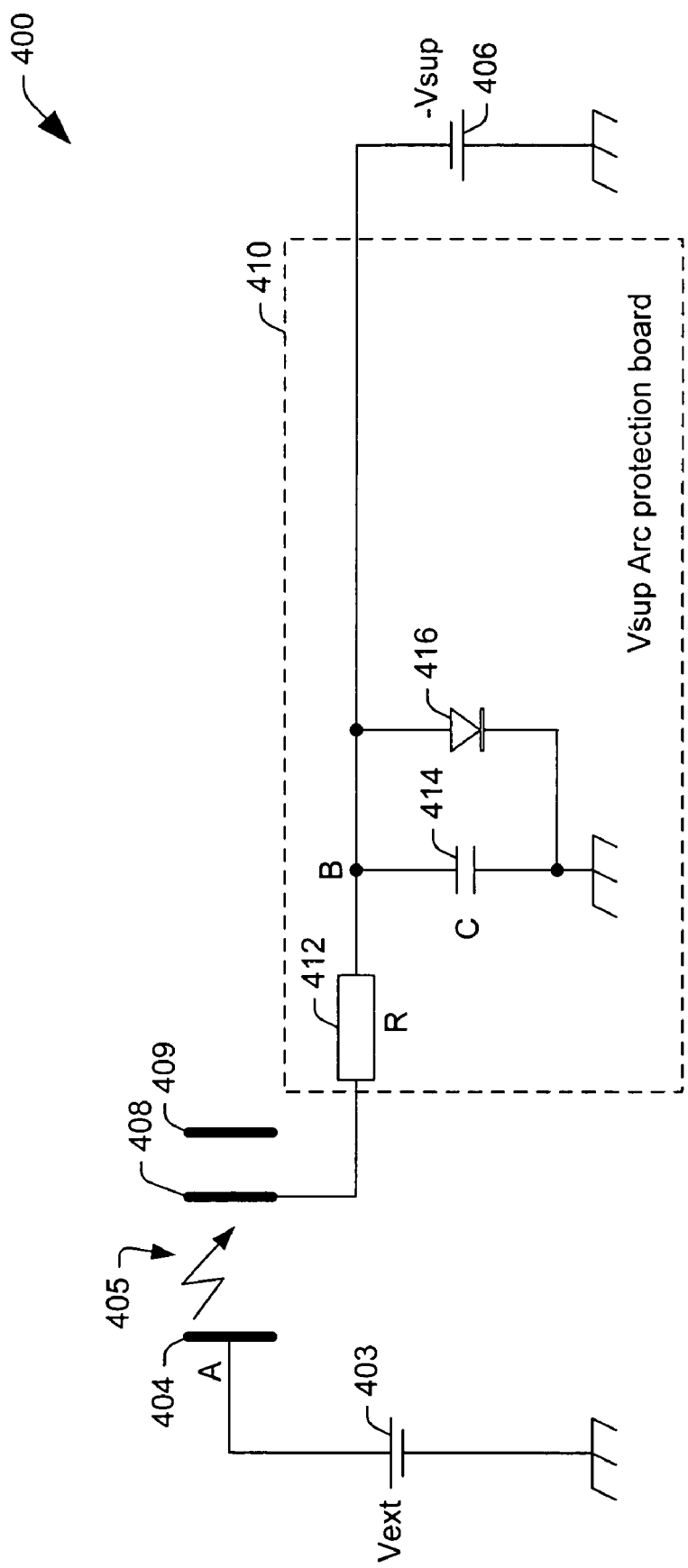
FIG. 4 is a simplified schematic diagram of an exemplary suppression electrode high voltage supply circuit having a conventional arc suppression circuit such as may be used in an ion implantation system.

FIG. 4 illustrates a portion of an exemplary ion implantation system 400 having high positive voltage extraction supply 403 which feeds extraction slits 404, and a high negative voltage suppression supply 406 which feeds suppression electrodes 408 neighboring ground electrodes 409. The HV suppression supply 406 has a conventional arc suppression or protection circuit 410, which may use a current limiting resistor 412 to limit the arc current to the suppression electrodes 408, a capacitor 414 to filter and stabilize the voltage of the supply, and a fly-back diode 416 to limit any reverse voltages generated from reactive elements of the circuit during arc on-off cycling. In the context of the present invention, the arc protection board 410 may also be used in association with the HVHS switch (e.g., 104 of FIG. 1) of the invention to protect the HVHS switch from damage.

Figure 5:
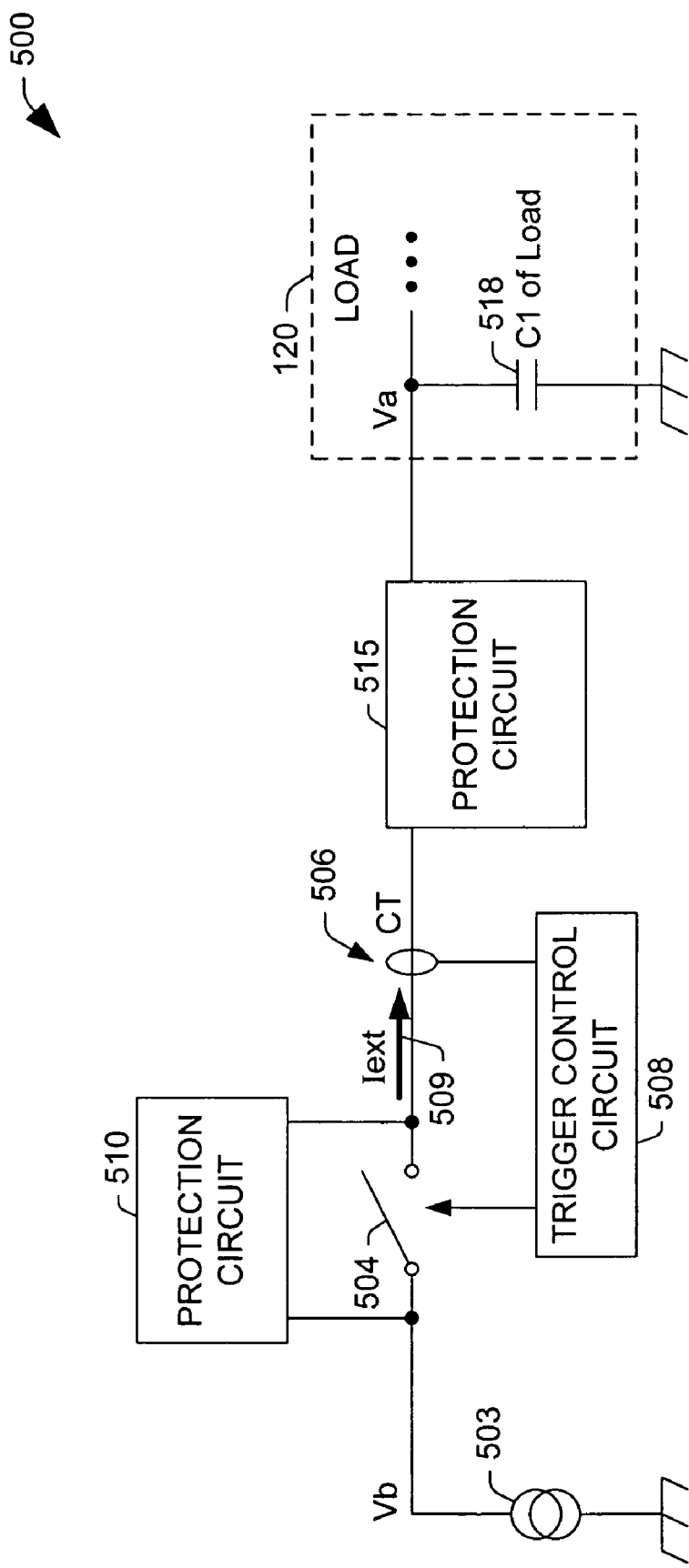
FIG. 5 is a simplified block diagram of an exemplary arc quenching circuit utilized in association with the high voltage supply of an ion source such as may be used in an ion implantation system in accordance with the present invention.

FIG. 5 illustrates an exemplary arc quenching circuit 500 utilized in association with a high voltage supply of an ion source such as may be used in an ion implantation system in accordance with the present invention. For example, arc quenching circuit 500 comprises a high voltage supply (Vb) 503 (e.g., a high voltage positive supply) connected in series with a HVHS switch 504 (e.g., a series stack of MOSFET transistors) and a series switch protection circuit 515, which drives a load (e.g., an ion source 120). The HVHS switch 504 is also connected in parallel with a parallel protection circuit 510 which protects the switch 504 from reactive overvoltages, for example. Arc quenching circuit 500, further comprises a current transformer CT 506 that detects a change of current in the supply 503 to the ion source 120, used for example, for producing a quantity of ions that can be extracted in the form of an ion beam (e.g., ion beam 130 of FIG. 1).

Circuit 500 also includes a trigger control unit 508 for detecting a change of current in the supply current (Iext) 509 to the ion source 120. If a current surge indicative of an arc, is detected in supply current (Iext) 509 by the CT 506, then the trigger control circuit 508 controls HVHS switch 504 to open and quench the arc. A capacitance C1 518 within the load (e.g., an ion source 120), and the voltage at the load (Va) is therefore isolated by HVHS switch 504 from the voltage Vb of the high voltage supply 503. Thus, Va at C1 514 of the load may discharge due to the occurrence of an arc, but the positive supply voltage Vb will remain generally charged at voltage due to isolation by the HVHS switch 504.

Again, the HVHS switch 504 is protected by parallel and series protection circuits 510 and 515, respectively, to absorb energy from reactive components external to the switch 504 and therefore protect the switch from over-voltage damage. The arc quenching circuit 500 of the present invention may be used in any ion implanter, or other such applications as may use a high voltage supply subject to arc discharges at the output of the supply.

Figure 6:
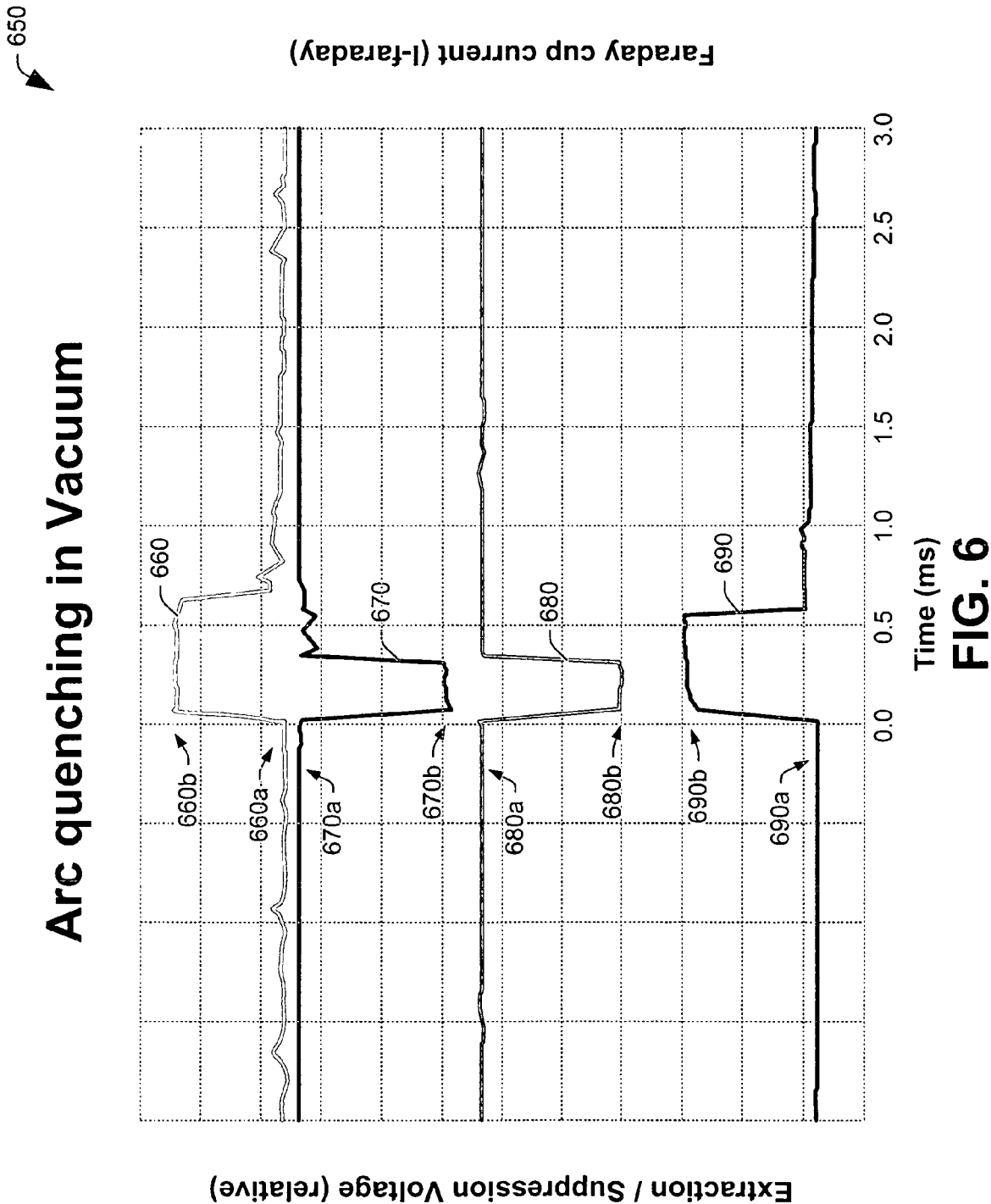
FIG. 6 is a graphical representation depicting the arc quenching effects of opening and closing a HVHS switch of the arc quenching circuit of the present invention tested in a vacuum during arcing of an extraction electrode associated with an ion source.

FIG. 6 illustrates the arc quenching effects of opening and closing a HVHS switch of the arc quenching circuit of the present invention tested in a vacuum (e.g, 650 of FIG. 6), during arcing of an extraction electrode associated with an ion source.

FIG. 6, illustrates a plot 650 of the relative amplitude level of signals provided by an arc quenching circuit (e.g., 500 of FIG. 5), in accordance with the present invention during arcing of an extraction electrode (e.g., 208 of FIG. 2) associated with an ion source (e.g., 120 of FIGS. 1 and 5), as tested in the actual vacuum environment, for example, of an ion implanter. FIG. 6 further illustrates the faraday current detected 660, during the opening and closing of a HVHS switch (e.g., 504 of FIG. 5) as measured at the extraction electrode voltage Vext 670, which is fed by a high positive supply voltage, and as triggered by a Vext trigger control signal 680 derived by the current in the Vext power supply (e.g., from CT 506), and having a suppression voltage Vsup 690, which is fed by a high negative supply voltage. FIG. 6 further illustrates a voltage 670 across a HVHS switch 504 when the switch is closed producing a high Vext level 670a and when the switch is open producing a low Vext level 670b, the high voltage supply Vb 630 at the supply 503, and the high voltage Va 620 as seen at the load (e.g., 120).

FIG. 6 further demonstrates that the HVHS switch can not only greatly shorten the duration of the glitch, but also allows the ion beam to recover quickly. Additional explanations will be given in association with FIG. 10B.

Prior to time 0.0, when an arc occurs, the detected faraday current I-faraday 660 is at a high level 660a, the positive power supply voltage for electrode voltage Vext 670 is at a high positive voltage level 670a, the negative power supply voltage for electrode voltage Vsup 690 is at a low negative voltage level 690a, and Vext trigger control signal 680 provides a switch closed 680a signal to switch 504, which produces a high Vext level 670a. At time 0.0, an arc occurs on the high voltage supply (e.g., Va 620), for example, at the Vext electrode, and the Vext 670 and Vsup 690 voltages quickly drop to zero, for example, as shown at 670b and 690b, respectively. In response, the current detected by CT 506, for example, is received by trigger control circuit 508 and provides a switch open 680b signal on Vext trigger control signal 680 to control HVHS switch 504 to open, which produces a low Vext level 670b. In addition, the detected faraday current I-faraday 660 drops to a low current level 660b. With the HVHS switch now open, and after about 0.3 ms, the Vext trigger control signal 680 returns to the 680a level indicating that the arc has been extinguished, and Vext trigger control signal 680 controls the HVHS switch to re-close, and in response Vext 670 returns to the 670a level.

Thereafter, at around 0.6 ms, and with the arc extinguished, the supply voltage at the load begins to recover enough for Vsup 690 to recover to the Vsup 690a level again, and shortly thereafter at about 0.65ms-0.7 ms the beam current recovers as indicated by I-faraday 660 recovering back to the 660a level. Thus, it is shown that the arc quench circuit of the present invention is able to quench an arc in the high voltages electrodes of an ion implanter, for example, and minimize the length of an ion beam glitch to about 0.7 ms.

Figure 7:
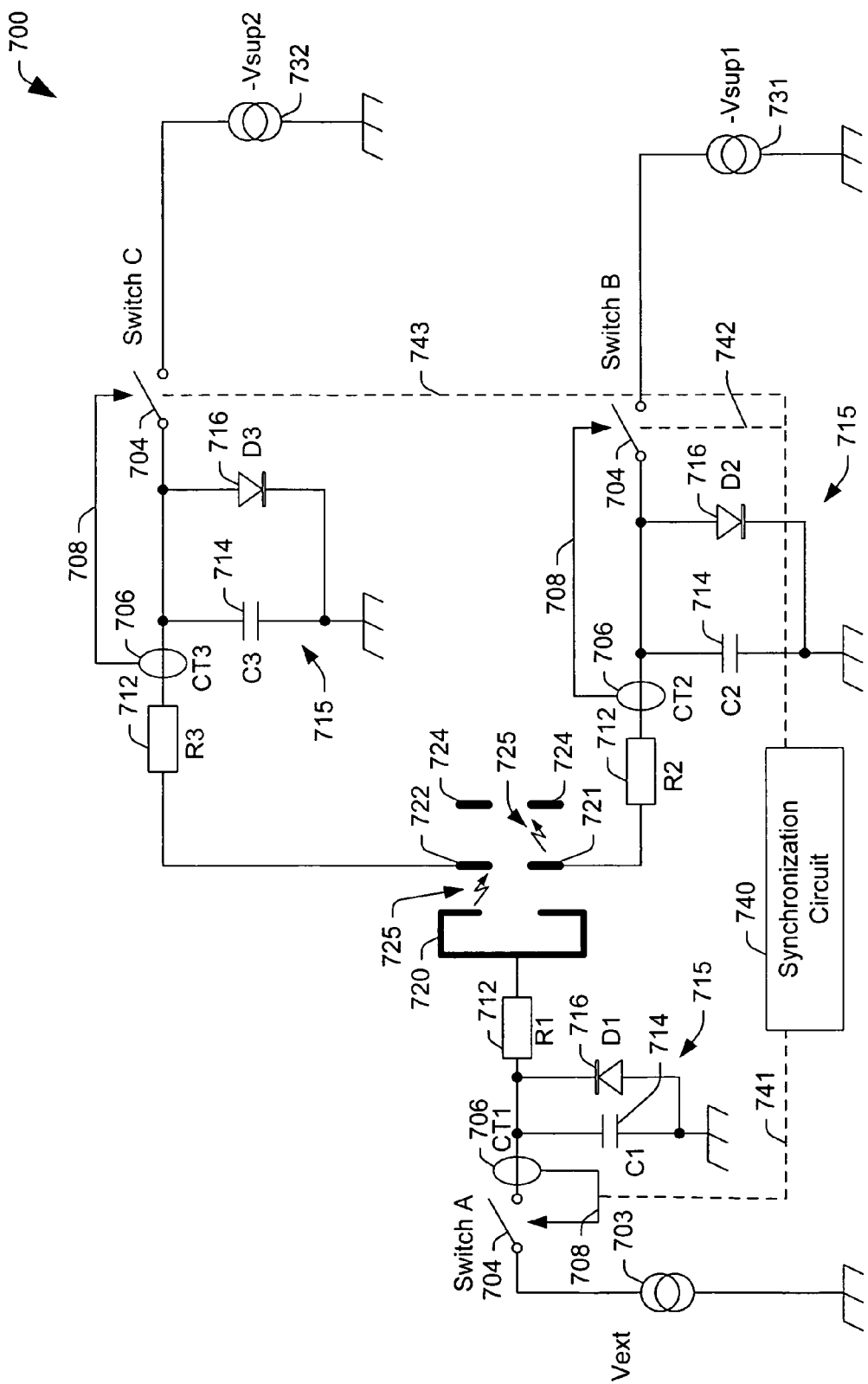
FIG. 7 is a simplified schematic diagram of an exemplary arc quenching circuit used in an ion implanter, utilizing a HVHS switch in three high voltage supplies of the ion implanter, and utilizing a synchronization circuit to sequence and synchronize the reestablishment of the current and voltage to each of three electrodes and high voltage supply circuits illustrated and associated with an ion implantation system.

FIG. 7 illustrates a simplified schematic representation of an exemplary arc quenching circuit 700 used in an ion implanter in accordance with several aspects of the present invention. Arc quenching circuit 700 is similar in several ways to that of FIGS. 1, 4 and 5, and as such need not be completely described again for the sake of brevity. Circuit 700 utilizes HVHS switches (A, B, and C) 704 (e.g., a series stack of MOSFET transistors) in three separate high voltage power supplies (Vext 703, −Vsup1 731, and −Vsup2 732) of the ion implanter. Arc quenching circuit 700 also comprises current transformers (CT1, 2, and 3) 706 for detecting current surges in each respective high voltage supply, and received by trigger control circuits 708 to control switches A, B, C 704 to open upon detection of the current surge indicative of an arc 725 at the respective ion beam electrode, for example, extraction electrode or arc slit 720, suppression electrodes 721 and 722, or ground electrodes 724. As illustrated, and in accordance with one aspect of the present invention, each independent electrode supply (e.g., Vext 703, −Vsup1 731, and −Vsup2 732) may independently arc to ground or another electrode, thus each HV supply may be protected by another such HVHS switch.

Arc quenching circuit 700 further comprises arc protection circuits 715 having a current limiting resistor (R1, 2, and 3) 712, filter capacitor (C1, 2, and 3) 714, and flyback diode (D1, 2, and 3) 716 to protect the HVHS switches 704 from switching transients and other such overvoltage damage induced by reactive components of the circuits associated with each HV supply.

Circuit 700 also utilizes a synchronization circuit 740 to sequence and synchronize the reapplication of the supply voltage to each of three respective high voltage electrodes 720, 721, and 722. For example, it may be determined that synchronization circuit 740 should re-close switches B and C 704 after re-closing switch A. Further, synchronization circuit 740 may provide time delays appropriate for reapplication of each individual HV supply. Any other sequence or timing relationships between the supplies is anticipated, including multiple switch reapplications and/or re-openings with any number of HVHS switches connected in series or parallel with each other or with each HV supply.

It will be appreciated that self-adaptive switching and synchronization controls, can be used as a variation of the synchronization circuit 740, within the context of the present invention, wherein changing currents, voltages, infrared or other wavelengths of light energy, or other such changes associated with or indicative of an arc 725, are monitored and used to adjust the sequence and/or timings of the synchronization to compensate or further mitigate such arc induced supply variations.

It will also be appreciated that the HVHS switches can be switched at one or more particular frequencies to modulate or otherwise provide dynamic pulse width control of the several electrode voltages, and/or the beam current in response to the detection of an arc. In addition to the detection and quenching of electrode arcs, the HV power supply modulation may also be provided in response to some known non-uniformity in the system (e.g., where a particular beam current results in a predictable non-uniformity). It may also be appreciated that while one use of such modulation is to achieve a uniform dosage on a wafer, it could be used to achieve any predetermined dopant profile, where uniformity is a subset of the general case.

It is further appreciated that arc quenching circuit of the present invention may be utilized prior to the implantation as well as during implantation.

Alternately, the beam current can be monitored to control the arc quenching circuit or to otherwise regulate a relatively constant beam current in response to HV supply variations when electrode arcing occurs.

Figure 8:
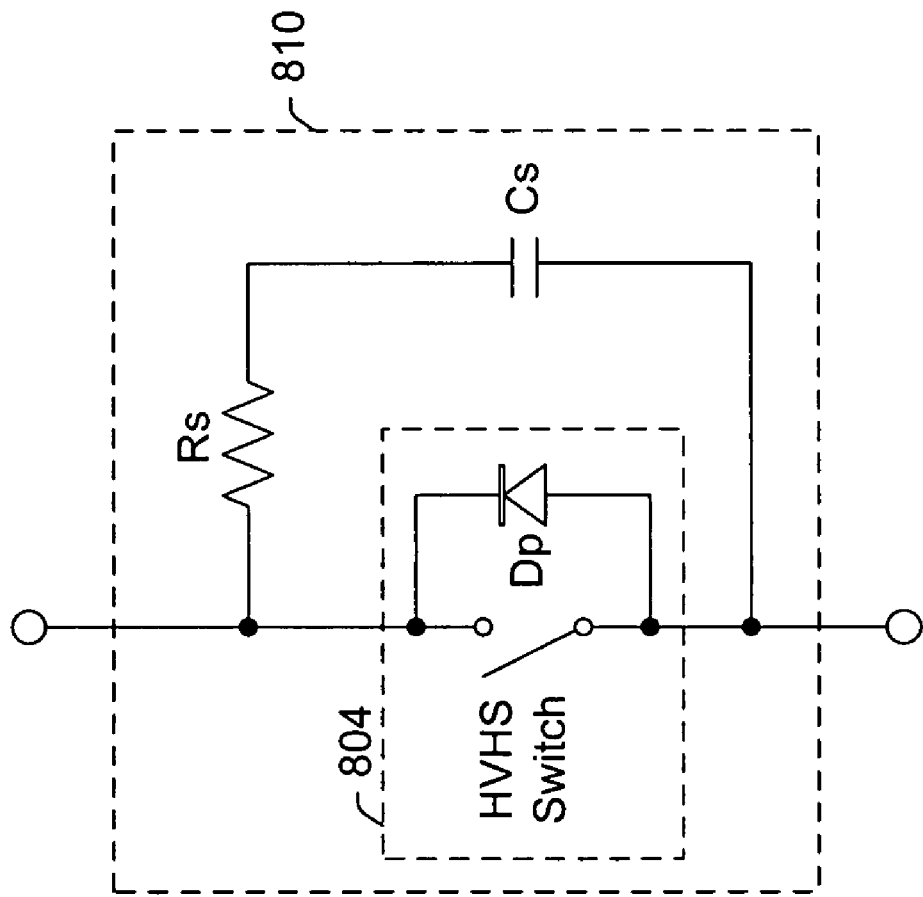
FIG. 8 is a schematic diagram of an exemplary protection circuit such as may be used across or in series with a HVHS switch to absorb energy from reactive elements external to the respective HV switch, and to limit an over-voltage across the switch in accordance with one or more aspects of the present invention.

FIG. 8 illustrates an exemplary protection circuit 810 such as may be used across or in series with a HVHS switch 804 to absorb energy from reactive elements external to the respective HV switch 804, and to limit an over-voltage across the switch in accordance with one or more aspects of the present invention. The protection circuit 810 also protects the switch 804 and other associated components by dampening any ringing induced by switching transients from the HVHS switch 804. Protection circuit 810 is similar to the protection circuit 110 of FIG. 1 and 510 of FIG. 5. Protection circuit 810 comprises a series capacitor Cs connected in series with a resistor Rs, the protection circuit 810 being wired in parallel with a HVHS switch 804. The HVHS switch 804 comprises a HVHS switch (e.g., a series stack of MOSFET transistors) and a diode Dp connected in parallel with the switch. The HVHS switch 804 may be provided, for example, with or without the parallel diode Dp.

It will be appreciated in the context of the present invention that two or more such HVHS switches may be connected in series or parallel with each other or with a HV supply to quench an arc that occurs in association with an ion source, an ion implanter, or any other such equipment utilizing high voltage power supplies, for example.

FIG. 9A illustrates a simplified diagram 900, of normal 2D wafer scanning motion between an exemplary ion beam 130 and a wafer 910, wherein the wafer 910 is moved simultaneously in a vertical direction 920 and a horizontal direction 930 by a motion control system, for example. The vertical scan motion 920 illustrated, generally may occur more slowly than the horizontal scan motion 930. The resulting scan motion provided by the exemplary motion control system produces a compound motion which has a somewhat diagonal scan vector across the wafer 910. These scans repeat each horizontal row and over-scan the edge of wafer 910 each horizontal scan until a wafer exchange position 935 is achieved past the edge of the wafer 910 at one extreme end of the horizontal scan 930 and the vertical scan 920.

A first scan (solid line) 936 of the ion beam 130, indicates an exemplary path starting from a first scan starting point (A) 940 and proceeds simultaneously through multiple horizontal scans motions and a vertical scan to a first scan end point (B) 945. A second scan (dotted line) 937 indicates an exemplary return path of the ion beam 130 (or wafer), which traverses to a second scan start point (C) 950 and proceeds through other multiple horizontal scan motions and a return vertical scan to a second scan end point (D) 955 and returns to the first scan start point A 940. Scanning continues in the manner until adequate dose is implanted in the wafer. Thereafter, the wafer scanning and implanting is completed and the wafer motion returns to the wafer exchange position 935 at the extreme end of the horizontal scan 930 exchange and process another wafer 910. The amount of over-travel of the relative motion between the ion beam 130 and the wafer 910 is also known as the overscan region 960.

FIGS. 9B-9G illustrate 2D wafer scan motion between an exemplary ion beam 130 and a wafer 910 similar to that of FIG. 9A and two methods of re-applying the ion beam (re-painting) after loss of the ion beam due to a disruption in the high voltage power supply caused by the occurrence of an arc, for example, at the high voltage electrodes.

When an arc is encountered during a wafer scan, the ion beam 130 may be disrupted either for a longer duration creating a glitch stripe 972 of FIGS. 9B-9D, or briefly creating a glitch hole 987 of FIGS. 9E-9G (a short disruption) each glitch having a corresponding loss of dose. These areas of dose loss may then be repainted in accordance with one or more aspects of the present invention.

In FIGS. 9B-9D, for example, when an arc occurs during implantation, the encoder positions of the horizontal and vertical motors driven by the motion control system may be monitored, so that the initial detection position X and final detection position Y associated with the arc may be recorded. The arc quenching circuit would function as previously described to quench the arc between initial detection position X and final detection position Y. Subsequent to the arc detection and quenching, the wafer scanning and ion implantation may continue as usual, or may proceed according to the example stripe repainting method as illustrated in FIGS. 9B-9D and as follows.

For example, wafer scanning proceeds as usual until an arc is detected at the initial detection position X, where the HVHS switch (e.g., 504, 704) is opened to disable the ion beam 130. Meanwhile, wafer scanning continues to the final detection position Y where motion decelerates to a stop. At Y the HVHS switch is closed again to re-enable the ion beam 130 for a repaint along the glitch stripe 972 as shown in FIG. 9C. As the wafer accelerates back up to speed horizontally, the vertical motion is reversed to repaint 977 the ion beam along glitch stripe 972 from the final detection position Y back to the initial detection position X, where the HVHS switch is opened again to disable the ion beam 130 until an end of the horizontal scan Z is encountered. Wafer scanning then moves the wafer from Z to Y and may or may not stop at Y, but with the HVHS switch remaining in the OFF or disabled state. Then, at Y, the HVHS switch is closed again to enable the ion beam. Then, the normal implantation operations continue until all the required scans are complete as previously described for FIG. 9A.

Similarly, in FIGS. 9E-9G, when an arc occurs during implantation, the wafer scanning and ion implantation may proceed according to the following exemplary hole repainting method illustrated and described, because the ion beam can not only be disabled quickly by the HVHS switch, but also can be enabled quickly by the HVHS switch. With the use of HVHS switch, the glitch will only leave a hole of less doped area on the wafer, and the hole of the start and ending position (initial and final position) can be recorded by a control computer. Therefore, the repaint can be done after the completion of the normal wafer scans. Thus, this repaint is so called the hole repaint.

For example, wafer scanning proceeds as usual until an arc is detected at an initial detection position W, where the HVHS switch (e.g., 504, 704) is opened to disable the ion beam 130 for a predetermined period of time, if, example, the glitch length exceeds about 1 ms. For example, the predetermined period of time may be about 5-20 ms to account for all anticipated arc durations. After the predetermined time period, the HVHS switch is closed to enable the ion beam at X, the final detection position. Meanwhile, wafer scanning motion continues as usual to a first row scan position Y and normal implantation operations continue until all the required scans are complete as shown in FIG. 9F, and as previously described for FIG. 9A.

Then, to perform a hole repaint 997 between W and X, the HV switch is opened to disable the ion beam 130, and the wafer is moved to a row repaint position Z corresponding to the beginning of the row wherein the glitch hole 987 occurred. The wafer scan moves toward Y, and the HVHS switch is closed again at W to re-enable the ion beam 130 for a repaint 997 along the glitch hole 987 as shown in FIG. 9G. When the wafer reaches X, the HV switch is opened to disable the ion beam 130. When the scan reaches the end of the horizontal scan Y the scan motion may stop and the hole repaint method is complete.

The advantage of doing a hole repaint is, that the wafer scanning will not be interrupted during the normal scan. Thus, the overall implantation productivity can be higher than that of the stripe repaint.

In addition to the stripe and hole repaint methods described above, for example, at the end of a horizontal scan 930 and vertical scan 920, at the wafer exchange position 935, or at the end of a particular row scan, a repaint process may be initiated, for example, by a modified trigger control circuit (e.g., 508 of FIG. 5, or 708 of FIG. 7), or a modified synchronization circuit (e.g., 740 of FIG. 7), as previously described. Such a modification would further make a trigger control circuit operable to receive a command (see 508 of FIG. 10A, and 1108 of FIG. 11) from the motion control system or the implanter computer to initiate the repaint process.

The repaint process initially may include turning OFF the ion beam 130 via the HVHS switch (e.g., 504, 704) for the ion source (e.g., 120 of FIG. 5) and the extraction/suppression electrodes 720, 722, for example. The ion beam 130 or wafer 910 may then be moved to a first horizontal and vertical scan position (e.g., W of FIG. 9E) where the arc was initially detected, for example, by first returning the beam to the beginning of the row (horizontal) Z wherein the arc was initially detected. In this way, the scan motion can begin a row as usual prior to encountering the position of the initial arc detection (e.g., W). Thus, the wafer will then be fully accelerated up to the same speed as that which was present when the arc was initially detected. Once at the position of initial arc detection W, the ion beam 130 is enabled by closing the HVHS switch (e.g., 504, 704), while the wafer 910 is horizontally and vertically scanned 930 and 920, respectively, in front of the ion beam 130. When a second horizontal and vertical scan position (e.g., X) associated with the final detection of the arc is encountered, the HVHS switch 504, 704 is opened again to disable the ion beam 130.

Alternately, the ion beam may be repainted 977 in the opposite direction of the initial scan direction, for example, starting from the final detection position Y of FIG. 9C, and proceeding in a scan direction to the initial detection position X. This direction, however, may not reproduce the dose losses as precisely as those achieved by repainting the ion beam 130 in the same direction as the original scan direction (see the original direction indicated by the arrow for short glitch hole 987 and long glitch stripe 972).

Figure 10A:
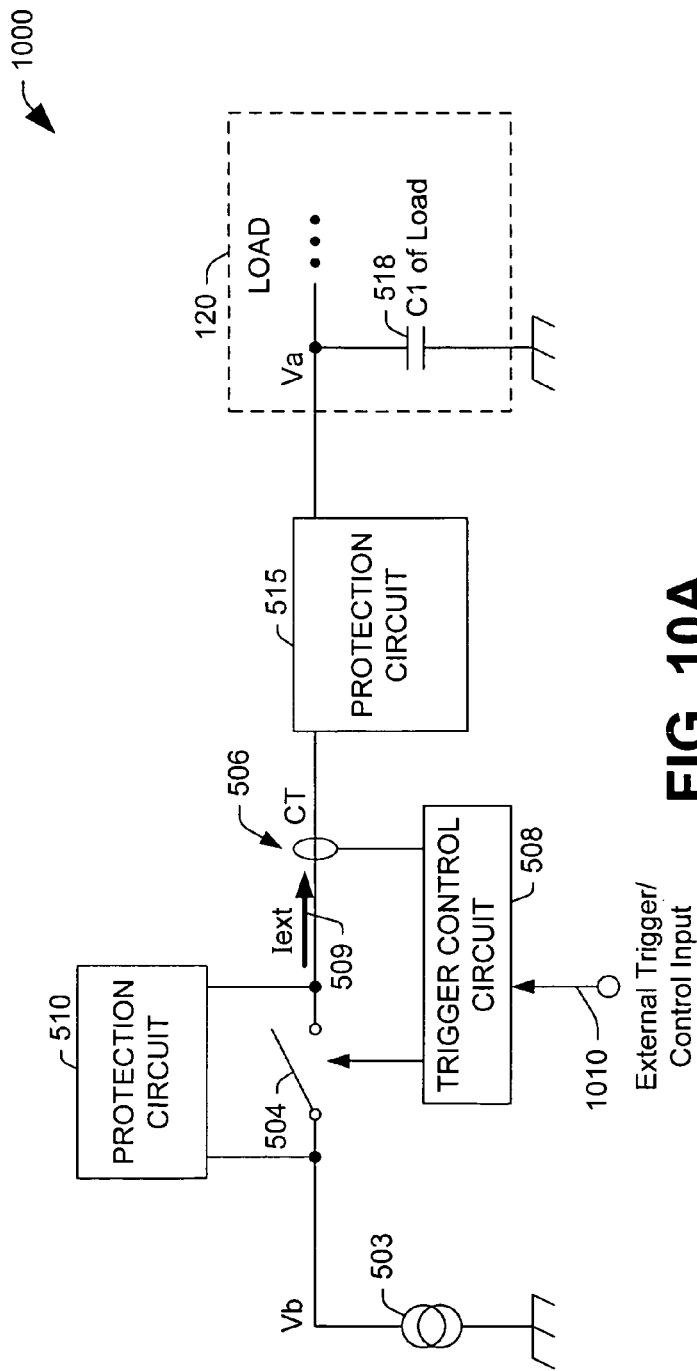
FIG. 10A is another simplified block diagram of an exemplary arc quenching circuit utilized in association with the high voltage supply of an ion source such as may be used in an ion implantation system in accordance with the present invention, wherein the trigger control circuit has an external trigger input for externally controlling the triggering of the HVHS switch, for example, with a faraday cup current input.

FIG. 10A illustrates an exemplary arc quenching circuit 1000 utilized in association with the high voltage supply 503 of an ion source 120 such as may be used in an ion implantation system (e.g., 200 of FIG. 2) in accordance with the present invention. The trigger control circuit 508 has an external trigger or control input 1010 for externally controlling the triggering of the HVHS switch 504, for example, by a computer, or by another such device.

Figure 10B:
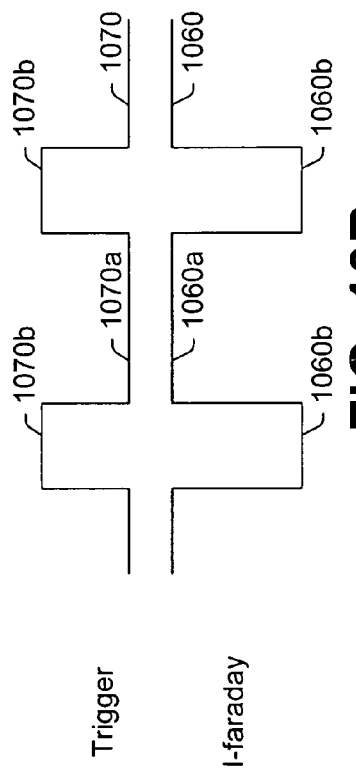
FIG. 10B illustrates the effect of external switch control as may be provided to the external trigger input of the exemplary arc quenching circuit of FIG. 10A, used in accordance with one or more aspects of the present invention.

FIG. 10B illustrates the effect of using external control of the HV switch to control the ion beam on and off. For example, external control may be provided in response to a faraday cup current (Ifaraday) waveform 1060 that provides a proportionate sample of the ion beam current (Ibeam). The faraday cup current 1060 is used to provide a trigger voltage 1070 for the external trigger input 1010 to the exemplary arc quenching circuit 1000 of FIG. 10A, such as may be used in accordance with one or more aspects of the present invention. For example, at a given instant of time, if the ion beam 130 is expected to be present at the faraday cup or on the wafer, a high current 1060*a* is produced, and a low level trigger voltage 1070*a* is applied. However, if the beam is not present at the faraday cup or on the wafer, faraday current 1060*b* is zero, and a high level trigger voltage 1070*b* is applied, which when provided to external trigger input 1010, switches OFF HVHS switch 504 to quench the arc. In this way, the switch can be used to artificially shut off or start the ion beam very quickly.

Figure 11:
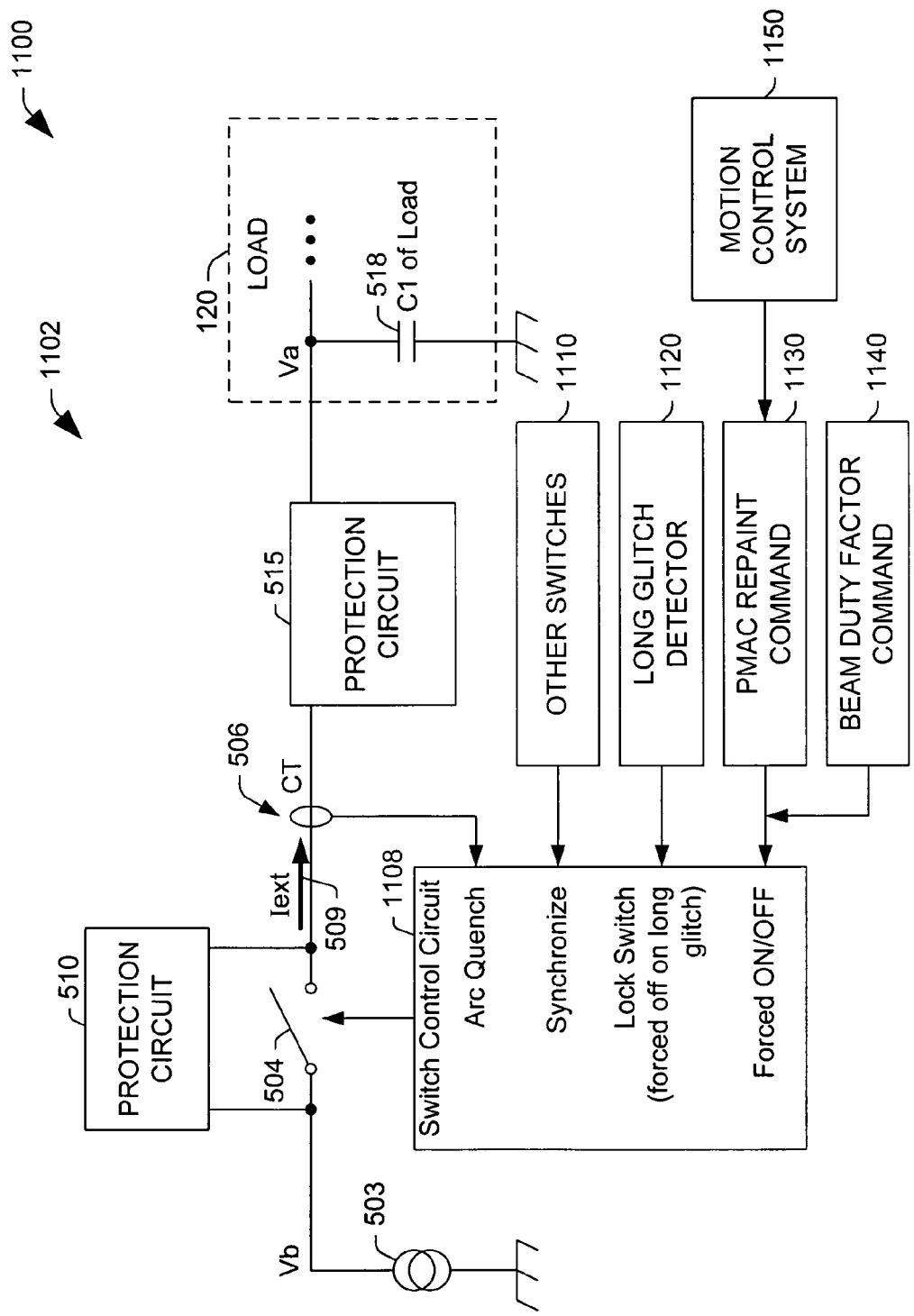
FIG. 11 is a simplified schematic diagram of an exemplary arc quenching controller used in an ion implanter, utilizing a HVHS switch between a high voltage supply and an electrode of the implanter, and utilizing a switch control circuit to sequence, control, and synchronize the reestablishment of the current and voltage to one or more electrodes, determine the duration of arc loss, and coordinate repaint commands from a motion control system or forced switch control commands from the ion implantation system in accordance with one or more aspects of the present invention.

FIG. 11 illustrates an exemplary arc quench controller 1100 having an arc quench circuit 1102, is used in an ion implanter (e.g., 200 of FIG. 2), utilizing a HVHS switch 504 between a high voltage supply 503 and an electrode (not shown) of the implanter 200. Arc quench controller 1100 is similar to the arc quenching circuits of FIGS. 5, 7, and 10A, and as such need not be completely described again for the sake of brevity. The arc quench controller 1100 utilizes a switch control circuit 1108 to sequence, control, and synchronize the reestablishment of the current and voltage to one or more electrodes from other switches 1110, to determine the duration of arc loss by long glitch detector 1120, and coordinate repaint commands 1130 from a motion control system 1150 or forced switch control commands 1140 from the ion implantation system in accordance with one or more aspects of the present invention.

Optionally, the other HVHS switches 1110 may be from other electrode supplies of the same ion implanter, or they may be from other HVHS switches of other similar arc quenching circuits (AQCs), which are not shown. These switches need to be synchronized to ensure the desired order and timing for opening and closing the switches 1110. As indicated above, the duration of a glitch, or loss of the ion beam, may be detected by a long glitch detector 1120, to determine if the glitch is long enough to require the repaint procedure as described above. Conversely, if a glitch is short enough, a determination may be made to ignore the loss. Such a determination level may be set, for example, by the end user of the ion implantation system. If a long glitch (e.g., 972 of FIG. 9B) is detected and a repaint of the ion beam 130 is required, the HVHS switch 504 could be forced OFF during the glitch to quench the arc.

Further, when the long glitch 972 is detected by long glitch detector 1120, the repaint process may be initiated upon assertion of the repaint command 1130 from the scan motion control system 1150. With the use of HVHS switches, the long glitch can be defined as the duration of the glitch longer than about 1 ms. During this repaint process, the HVHS switch control is forced ON/OFF, as illustrated in FIG. 10B, in response to the repaint command 1130, and in response to the positions achieved by the motion control system 1150, and as described previously.

In addition because the HVHS switches 504 are present in the circuit of the present invention to quench arcs, the implanter system is also provided with the ability to simply turn the ion beam 130 ON or OFF at will, either manually with a switch or by way of command 1140 from one of the implanters control systems, its computer, or by an external input.

As FIG. 10B illustrated, it may be particularly beneficial to be able to turn the beam 130 ON/OFF, for example, when loading or unloading a new wafer 910, during other types of wafer exchange, at the start/end of each wafer scan, or in the over-travel regions 960 of each row scan of a wafer 910. This is so called beam duty factor reduction. This is to say that by disabling the beam via the HVHS switches, the total time required of the ion beam in the beam line and the wafer process chamber is reduced. Accordingly, the glitch quench controller 1100 of the present invention facilitates reducing the "beam duty factor" should reduce the particle count on a wafer, because the beam will be used to a greater percentage usefully on the wafer 910 and less on the other surfaces of the implanter adjacent to the wafer 910 (e.g., in the over-travel regions 960).

Although the glitch quench circuits and glitch quench controller of the invention has been illustrated in association with a HV power supply for an ion source and an extraction electrode, it will be appreciated that such circuits may also be used in association with the other HV supplies and electrodes of an ion implanter, or other such ion sources and accelerators, including other HV applications subject to HV arcing and are anticipated in the context of the present invention.

One aspect of the present invention provides a method of quenching an arc and repainting the ion beam is presented and described. One implementation of the present invention effectively quenches such high voltage arcs which occur at an electrode of an ion implanter and by opening a high voltage high speed switch wired in series between the electrode and a high voltage supply which provides the electrode potential to control the ion beam. When the arc is then extinguished, the electrode potential is restored, before the HV supply has had a chance to fully discharge.

Thereafter, any dose losses experienced during the arcing may be restored by returning the ion beam/wafer to the location where the arc occurred, repainting the ion beam over such areas, and toggling the ion beam ON/OFF during the repaint operation using the same HVHS switch.

Figure 12:
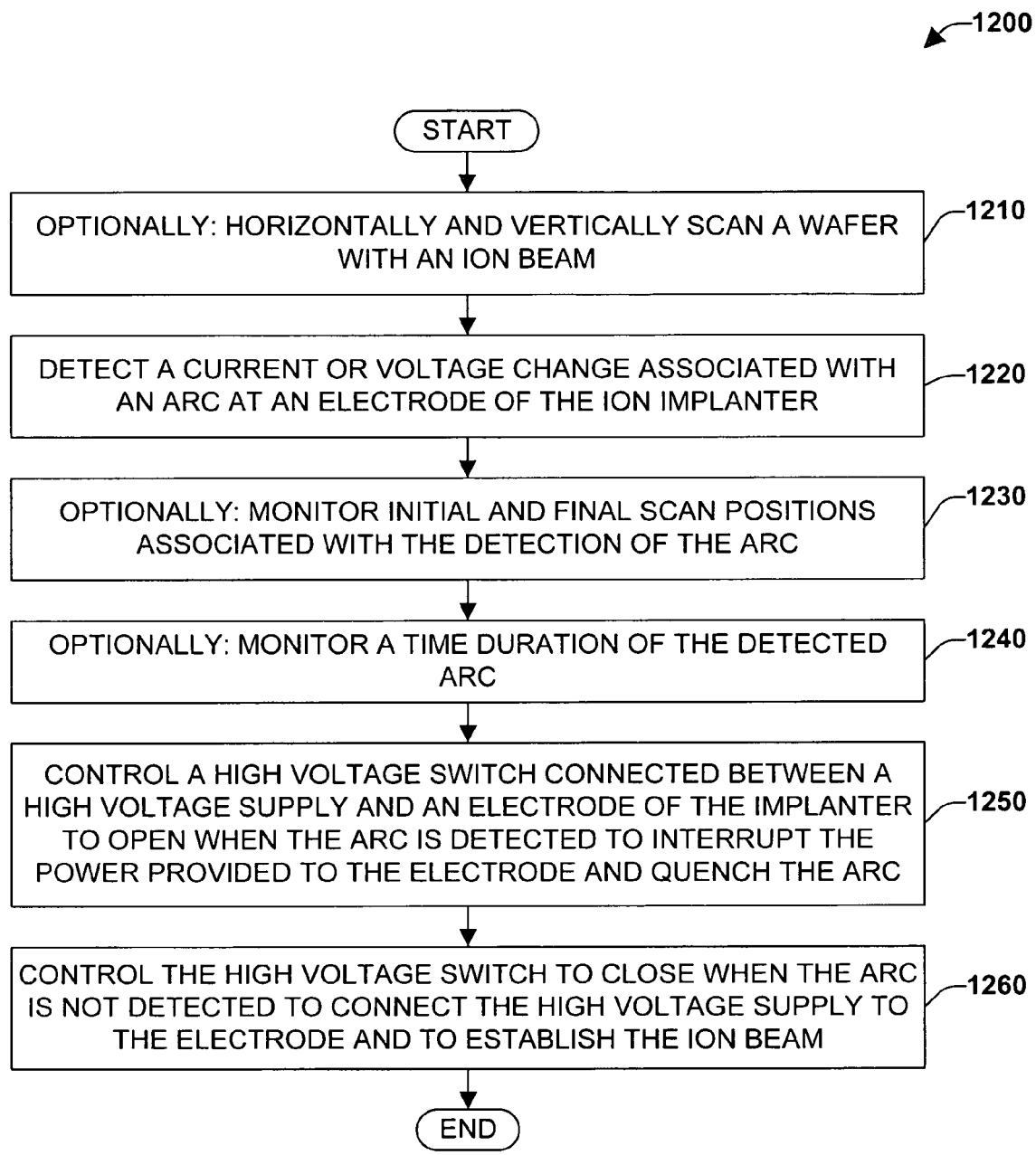
FIG. 12 is a flow diagram of an exemplary method for quenching an arc in an ion implanter, using an arc quenching circuit of the present invention in accordance with several aspects of the present invention.

One such method 1200 is illustrated in FIG. 12, representing an exemplary method for quenching an arc in an ion implanter, using an arc quenching circuit (e.g., 500 of FIG. 5, 700 of FIG. 7, and 1000 of FIG. 10A, or the arc quenching controller 1100 of FIG. 11) of the present invention in accordance with several aspects of the present invention. Although the example method 1200 is illustrated and described hereinafter as a series of acts or events, it will be appreciated that the present invention is not limited by the illustrated ordering of such acts or events. In this regard, some acts may occur in different orders and/or concurrently with other acts or events apart from those illustrated and/or described herein, in accordance with the invention. In addition, not all illustrated steps may be required to implement a methodology in accordance with the present invention. It is further noted that the methods according to the present invention may be implemented in association with the wafers, wafer cassettes, wafer sensor, wafer handling system, and modeling system illustrated and described herein as well as in association with other apparatus and structures not illustrated.

Method 1200 comprises an example arc quenching method that may be used to extinguish an arc that may occur at an ion beam controlling electrode of an ion implanter (e.g., 200 of FIG. 2), using an arc quenching circuit similar to circuit 1000 of FIG. 10A. For example, optionally, a wafer 910 may be in the process of being horizontally 930 and vertically 920 scanned at 1210 with an ion beam 130 (either by the wafer or the ion beam moving). At 1220, a current or voltage change (e.g., Va 620 of FIG. 6A) associated with the arc is detected (e.g., by CT 506 of FIGS. 5, 10A, and 11, or by a faraday cup 244 to provide I-faraday 1060 of FIG. 10B associated with the ion beam current Ibeam) at an electrode (e.g., extraction electrode 208 of FIG. 2) of the implanter 200.

Figure 13:
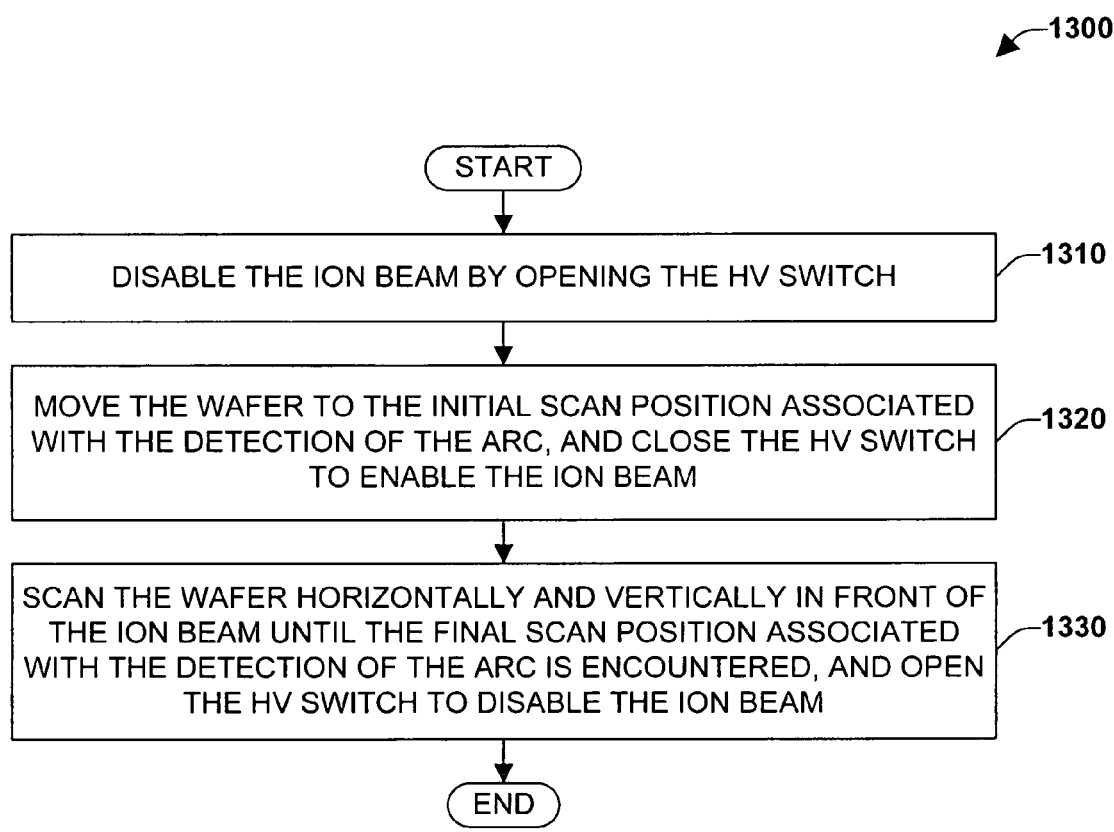
FIG. 13 is a flow diagram of an exemplary method for repainting the ion beam to recover dose loss due to arcing in an ion implanter, for example, using the arc quenching controller of FIG. 11 in accordance with one or more aspects of the present invention.

When an arc then occurs during implantation, the encoder positions of the horizontal and vertical motors driven by the motion control system (e.g., 1150 of FIG. 11) of the implanter 200 may optionally be monitored at 1230, so that the initial detection position (e.g., W of FIG. 9E) and final detection position (e.g., X of FIG. 9E) associated with the arc may be recorded for an optional repaint operation (e.g., method 1300 of FIG. 13). At 1240 the duration of such an arc may be optionally detected (e.g., by detector 1120 of FIG. 11) and used to determine if a subsequent repaint is desired. After the detection of an arc, the arc is quenched at 1250, by opening a HVHS switch 504 connected between a high voltage supply 503 and the electrode 208 of the implanter 200, thereby interrupting the power provided to the electrode 208 and quenching the arc. When the arc is no longer detected, the HVHS switch 504 is again closed at 1260 to reconnect the high voltage supply to the electrode and to re-establish the ion beam.

Optionally, the wafer scanning and ion implantation may continue as usual, for example, until the end of a row scan, or the end of a vertical scan 920, for example, at the wafer exchange position 935, or until the end of all the scans anticipated for a wafer 910. Then, a repaint process may be initiated, for example, by switch control unit 1108, or a modified synchronization circuit (e.g., 740 of FIG. 7), as previously described. The switch control circuit 1108 is operable to receive a command (see 508 of FIG. 10A, and 1108 of FIG. 11) from the motion control system 1150 or the implanter computer to initiate the repaint process.

FIG. 13 illustrates an exemplary method 1300 for repainting the ion beam 130 to recover dose loss due to arcing in an ion implanter 200, for example, using the arc quenching controller 1100 of FIG. 11 in accordance with one or more aspects of the present invention.

Method 1300 comprises an example ion repainting method that may be used to restore the ion dose loss during arcing in an ion implanter (e.g., 200 of FIG. 2), using an exemplary arc quenching controller 1100 of FIG. 11. After an arc has been extinguished, and at the end of a horizontal scan 930, or at the end of a vertical scan 920, for example, the repaint process may be initiated. Initially, at 1310, the ion beam 130 is again turned OFF, for example, using the HVHS switch (e.g., 504, 704) to the ion source (e.g., 120 of FIG. 5) and the extraction/suppression electrodes 720, 722, for example.

The ion beam 130 or wafer 910 is then moved at 1320, to a first horizontal and vertical scan position (e.g., W of FIG. 9E) where the arc was initially detected, for example. This movement to the initial scan position W may be done by first returning the beam to the beginning of the row Z wherein the arc was initially detected. In this way, the scan motion can begin a row as usual prior to encountering the position of the initial arc detection (e.g., W of FIG. 9E). Thus, the wafer will then be fully accelerated up to the same speed as that which was present when the arc was initially detected. Once at the position of initial arc detection (e.g., W of FIG. 9E), the ion beam 130 is also enabled at 1320 by closing the HVHS switch (e.g., 504, 704). At 1330, the wafer 910 is horizontally and vertically scanned 930 and 920, respectively, in front of the ion beam 130 until a second horizontal and vertical scan position (e.g., X of FIG. 9G) associated with the final detection of the arc is encountered, and the HVHS switch 504, 704 is opened again to disable the ion beam 130.

Thereafter, other such arc detection holes 987 or stripes 972 which occurred during the ion implantation may also be repainted in a similar manner, either separately in multiple scans or collectively in a single scan as needed. Further, it is appreciated that the ion beam may be repainted in the opposite direction of the initial scan direction, for example, starting from the final detection position, and proceeding with the repaint toward the initial detection position.

The HVHS switches are basically applied to the extraction systems of any ion sources. It will be appreciated that the aspects described herein are equally applicable to other ion sources including those that provide primary electron beam current in "soft ionization" ion sources, RF or microwave power in RF or microwave ion sources, as well as to non-arc discharge sources.

Although the invention has been illustrated and described above with respect to a certain aspects and implementations, it will be appreciated that equivalent alterations and modifications will occur to others skilled in the art upon the reading and understanding of this specification and the annexed drawings. In particular regard to the various functions performed by the above described components (assemblies, devices, circuits, systems, etc.), the terms (including a reference to a "means") used to describe such components are intended to correspond, unless otherwise indicated, to any component which performs the specified function of the described component (i.e., that is functionally equivalent), even though not structurally equivalent to the disclosed structure, which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "includes", "including", "has", "having", "with" and variants thereof are used in either the detailed description or the claims, these terms are intended to be inclusive in a manner similar to the term "comprising". Also, the term "exemplary" as utilized herein simply means example, rather than finest performer.

What is claimed is:

1. A method of quenching an arc in an ion implantation system and repainting the ion beam to recover any dose loss during such arcing using an arc quenching circuit associated with a high voltage supply for an electrode of the ion implantation system comprising:

horizontally scanning a wafer in front of the ion beam;
vertically scanning the wafer in front of the ion beam;
detecting a current or voltage change associated with the arc at the electrode;
monitoring horizontal and vertical scan motions to obtain initial and final scan positions associated with the detection of the arc;
controlling a HV switch connected between the high voltage supply and the electrode to open when the arc is detected in order to interrupt the high voltage supply to the electrode and to quench the arc;
controlling the HV switch to close when the arc is not detected in order to connect the high voltage supply to the electrode and to reestablish the ion beam; and
repainting the ion beam after an arc, the repainting process comprising:
disabling the ion beam by opening the HV switch;
moving the wafer to the initial or final scan position associated with the detection of the arc, and closing the HV switch to enable the ion beam; and
scanning the wafer horizontally and vertically in front of the ion beam until the other of the initial or final scan position associated with the detection of the arc is encountered, and opening the HV switch to disable the ion beam.

2. The method of claim 1, further comprising synchronizing two or more arc quenching circuits having two or more high voltage switches used to quench an arc between the electrodes of two or more respective high voltage power supplies for the ion implanter, and repainting the ion beam after an arc from the electrodes.

3. The method of claim 1, further comprising monitoring a time duration of the detected arc, and wherein the repainting process is only accomplished if the time duration of the arc detected is longer than a predetermined interval.

4. The method of claim 1, wherein the repainting process is delayed until the ion beam scan returns to a wafer exchange position of the wafer.

5. The method of claim 1, wherein the repainting process is delayed until the ion beam scan completes a current horizontal scan movement.

6. The method of claim 1, wherein the horizontal and vertical scanning continue after the detection of an arc.

7. The method of claim 6, wherein the repainting process is delayed until the end of the ion beam scans, wherein one or more arc detections may be repainted collectively during one or more continuous scan movements.

8. The method of claim 1, wherein the ion beam is forced on or off by the HV switch.

9. The method of claim 1, wherein the HV switch is opened for a predetermined time period following the detection of the arc.

10. The method of claim 1, wherein monitoring the horizontal and vertical scan positions associated with the detection of an arc, comprises monitoring motion encoders coupled to horizontal and vertical scan motors, and storing encoder position data associated with the initial detection of the arc, and the final detection of the arc.

11. The method of claim 1, wherein the ion beam is forced on or off in response to a beam duty factor command from the ion implantation system or a motion control system to disable the ion beam during one of, arrival at a wafer load or unload position, a manual beam OFF switch operation, and a wafer exchange, and to enable the ion beam during one of, a manual beam ON switch operation, subsequent to a wafer exchange, following a load operation, and upon a command to implant another wafer.

12. The method of claim 1, wherein the repainting process further comprises:
monitoring a time duration of the detected arc, and repainting only if the time duration of the detected arc is longer than a predetermined interval;
continuously scanning the wafer vertically and horizontally in front of the ion beam;
forcing the HV switch open to disable the ion beam for a predetermined time that is longer than any anticipated arc duration;
forcing the HV switch closed again such that the ion beam recovers;
forcing the HV switch to open after completing a requested wafer scan;
moving the wafer to the initial scan position associated with the detection of the arc in preparation for the repaint;
closing the HV switch to enable the ion beam; and
repainting by scanning the wafer horizontally and vertically in front of the ion beam until the final scan position associated with the detection of the arc is encountered, and opening the HV switch to disable the ion beam.

13. A method of quenching an arc in an ion implantation system having an arc quenching circuit used in association with a high voltage supply for an electrode of the ion implantation system comprising:
detecting a current or voltage change associated with the arc at the electrode;
monitoring horizontal and vertical scan motions associated with the ion beam and a wafer being scanned by the ion implanter to obtain initial and final scan positions associated with the detection of the arc;
controlling a HV switch connected between the high voltage supply and the electrode to open when the arc is detected in order to interrupt an arc current to the electrode and to quench the arc; and
controlling the HV switch to close when the arc is not detected in order to connect the high voltage supply to the electrode and to establish the ion beam.

14. The method of claim 13 wherein the horizontal and vertical scanning continue after the detection of an arc.

15. The method of claim 13 wherein monitoring the horizontal and vertical scan positions associated with the detection of an arc, comprises monitoring motion encoders coupled to horizontal and vertical scan motors, and storing encoder position data associated with the initial detection of the arc, and the final detection of the arc.

16. The method of claim 13, further comprising synchronizing two or more arc quenching circuits having two or more high voltage switches used to quench an arc between the electrodes of two or more respective high voltage power supplies for the ion implanter, and repainting the ion beam after an arc from the electrodes.

17. An ion implantation system comprising:
an ion source for producing a quantity of ions which can be extracted in the form of an ion beam, the ion beam having a beam current;
one or more high voltage switches, each switch connected in series with a high voltage power supply for a respective electrode associated with the implanter, each high voltage switch operable to interrupt and reestablish a current to the respective electrode to quench an arc produced within the ion implantation system;
a trigger control circuit coupled to the one or more high voltage switches, operable to detect a current or voltage change associated with at least one of the electrodes and to control the respective one or more high voltage switches to open or close based on the detection and an initial and final scan position associated with the arc; and
one or more protection circuits, each protection circuit associated with one of the high voltage switches, operable to absorb energy from reactive elements external to the respective high voltage switch, and to limit an overvoltage across the respective high voltage switch.

18. A method of repainting an ion beam to a wafer in an ion implantation system following detection and quenching of an arc using an arc quenching circuit associated with a high voltage supply for an extraction electrode of the ion implantation system to recover any dose loss during such arcing, the repainting method comprising:
scanning the wafer in front of the ion beam using horizontal and vertical scan motions;
detecting a current or voltage change associated with the arc;
monitoring the wafer scan motions to obtain an initial scan position associated with the detection of the arc;
controlling a HV switch of the arc quenching circuit connected between the high voltage power supply and the electrode to open when the arc is detected in order to interrupt the power to the electrode and to quench the arc;
monitoring the wafer scan motions to obtain a final scan position associated with the detection of the arc, wherein the arc is no longer detected; and
controlling the HV switch to close when the arc is not detected in order to reconnect the high voltage supply to the electrode and to reestablish the ion beam.

19. The method of claim 18, wherein the HV switch of the arc quenching circuit is held open for a predetermined time period after the arc is initially detected and before controlling the HV switch to close when the arc is not detected.

20. The method of claim 19, further comprising repainting the wafer in front of the ion beam after the end of the wafer scans, the repainting comprising;
   disabling the ion beam by opening the HV switch;
   moving the wafer to the initial or final scan position associated with the detection of the arc, and closing the HV switch to enable the ion beam; and
   scanning the wafer in front of the ion beam until the other of the initial or final scan positions associated with the detection of the arc is encountered, and opening the HV switch to disable the ion beam.

21. The method of claim 20, wherein one or more arc detections is repainted collectively during one or more continuous scan motions.

22. The method of claim 18, further comprising repainting the ion beam after the arc detection, the repainting process comprising:
   disabling the ion beam at the initial scan position associated with the detection of the arc by opening the HV switch;
   continue scanning the wafer until the end of the present horizontal scan motion and the final scan position associated with the detection of the arc;
   enabling the ion beam by closing the HV switch;
   scanning the wafer in front of the ion beam from the final scan position associated with the detection of the arc toward the initial scan position associated with the detection of the arc,
   disabling the ion beam at the initial scan position associated with the detection of the arc by opening the HV switch;
   scanning the wafer in front of the ion beam until the final scan position associated with the detection of the arc is again encountered, and closing the HV switch to enable the ion beam; and
   scanning the wafer in front of the ion beam until the end of the wafer scans, and opening the HV switch to disable the ion beam.

23. The method of claim 18, further comprising synchronizing two or more arc quenching circuits having two or more high voltage switches used to quench an arc between the electrodes of two or more respective high voltage power supplies for the ion implanter, and repainting the ion beam after an arc from the electrodes.

24. The method of claim 18, further comprising monitoring a time duration of the detected arc, and wherein the repainting process is only accomplished if the time duration of the arc detected is longer than a predetermined interval.

25. The method of claim 18, wherein the repainting process is delayed until the ion beam scan returns to a wafer exchange position.

26. The method of claim 18, wherein the repainting process is delayed until the ion beam scan completes a current horizontal scan movement.

27. The method of claim 18, wherein the repainting process is delayed until the end of the wafer scans, wherein one or more arc detections may be repainted collectively during one or more continuous scan movements
   disabling the ion beam by opening the HV switch;
   moving the wafer to the initial or final scan position associated with the detection of the arc, and closing the HV switch to enable the ion beam; and
   scanning the wafer in front of the ion beam until the other of the initial or final scan positions associated with the detection of the arc is encountered, and opening the HV switch to disable the ion beam.

28. The method of claim 18, wherein monitoring the horizontal and vertical scan positions associated with the detection of an arc, comprises monitoring motion encoders coupled to horizontal and vertical scan motors, and storing encoder position data associated with the initial detection of the arc, and the final detection of the arc.

29. The method of claim 18, wherein the ion beam is forced on or off in response to a beam duty factor command from the ion implantation system or a motion control system to disable the ion beam during one of, arrival at a wafer load or unload position, a manual beam OFF switch operation, and a wafer exchange, and to enable the ion beam during one of, a manual beam ON switch operation, subsequent to a wafer exchange, following a load operation, and upon a command to implant another wafer.

30. A method of quenching an arc associated with an ion beam in an extraction system of an ion source comprising:
   detecting a current or voltage change associated with the arc within the extraction system;
   monitoring horizontal and vertical scan motions to obtain initial and final scan positions associated with the detection of the arc;
   controlling a high voltage switch connected between a high voltage supply and the extraction system to open when the arc is detected in order to interrupt the high voltage supply to the electrode and to quench the arc; and
   controlling the HV switch to close when the arc is not detected in order to reconnect the high voltage supply to the extraction system and to reestablish the ion beam.

31. The method of claim 30 further comprising: scanning a wafer in front of the ion beam using horizontal and vertical scan motions.

32. The method of claim 31, further comprising repainting the wafer in front of the ion beam after the arc has been detected and the ion beam has been reestablished, the repainting comprising:
   disabling the ion beam by opening the high voltage switch;
   moving the wafer to the initial or final scan position associated with the detection of the arc, and closing the high voltage switch to enable the ion beam; and
   scanning the wafer in front of the ion beam until the other of the initial or final scan positions associated with the detection of the arc is encountered, and opening the high voltage switch to disable the ion beam.

33. The method of claim 30, wherein the high voltage switch is held open for a predetermined time period after the arc is initially detected and before controlling the HV switch to close when the arc is not detected.

34. The system of claim 17, further comprising a synchronization circuit operable to synchronize and time two or more trigger control circuits for the opening and closing of two or more high voltage switches for the ion implantation system.

* * * * *